(12) United States Patent
Parkhe

(10) Patent No.: US 10,957,572 B2
(45) Date of Patent: Mar. 23, 2021

(54) MULTI-ZONE GASKET FOR SUBSTRATE SUPPORT ASSEMBLY

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 354 days.

(21) Appl. No.: 15/969,664

(22) Filed: May 2, 2018

(65) Prior Publication Data

US 2019/0341289 A1 Nov. 7, 2019

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32724* (2013.01); *H01L 21/67103* (2013.01); *H01J 37/32* (2013.01); *H01J 2237/002* (2013.01); *H01L 21/67* (2013.01); *H01L 21/683* (2013.01)

(58) Field of Classification Search
USPC .......................................... 361/234
See application file for complete search history.

(56) References Cited

U.S. PATENT DOCUMENTS

| | | |
|---|---|---|
| 4,273,148 A | 6/1981 | Charland |
| 4,305,567 A | 12/1981 | Lunt |
| 4,776,602 A | 10/1988 | Gallo |
| 5,421,594 A | 6/1995 | Becerra |
| 5,535,090 A | 7/1996 | Sherman |
| 5,851,298 A | 12/1998 | Ishii |
| 6,219,219 B1 | 4/2001 | Hausmann et al. |
| 6,310,755 B1 | 10/2001 | Kholodenko et al. |
| 6,409,178 B1 | 6/2002 | Raden et al. |
| 6,503,368 B1 | 1/2003 | Kholodenko et al. |
| 7,697,260 B2 | 4/2010 | Brown et al. |
| 8,194,384 B2 | 6/2012 | Nasman et al. |
| 8,390,980 B2 | 3/2013 | Sansoni et al. |
| 8,559,159 B2 | 10/2013 | Roy et al. |
| 2002/0050246 A1 | 5/2002 | Parkhe |
| 2002/0050261 A1 | 5/2002 | Miyahara et al. |
| 2003/0104186 A1 | 6/2003 | Ito |
| 2006/0096946 A1 | 5/2006 | Schaepkens et al. |
| 2006/0098379 A1 | 5/2006 | Otaka et al. |
| 2006/0279899 A1 | 12/2006 | Aihara et al. |

(Continued)

OTHER PUBLICATIONS

Pollock, M., ed., "GRAFOIL® Flexible Graphite, Engineering Design Manual," 2nd edition, Copyright 2002, 117 pages, Graphtech Inc.

(Continued)

*Primary Examiner* — Danny Nguyen
(74) *Attorney, Agent, or Firm* — Lowenstein Sandler LLP

(57) ABSTRACT

A gasket for a substrate support assembly may have a top surface having a surface area and a plurality of zones that together define the surface area of the top surface. The plurality of zones may comprise at least a) a first zone comprising a first stack of gasket layers, the first zone having a first average thermal conductivity in a first direction, and b) a second zone comprising one or more gasket layers, the second zone having a second average thermal conductivity in the first direction.

20 Claims, 10 Drawing Sheets

(56) References Cited

U.S. PATENT DOCUMENTS

| | | |
|---|---|---|
| 2008/0029032 A1 | 2/2008 | Sun et al. |
| 2008/0138645 A1 | 6/2008 | Kawajiri et al. |
| 2010/0003824 A1 | 1/2010 | Kadkhodayan et al. |
| 2010/0020463 A1 | 1/2010 | Nasman et al. |
| 2010/0039747 A1 | 2/2010 | Sansoni et al. |
| 2010/0184298 A1* | 7/2010 | Dhindsa ............ C23C 16/45565 438/710 |
| 2011/0292562 A1 | 12/2011 | Lee et al. |
| 2012/0076574 A1 | 3/2012 | Parkhe |
| 2012/0100379 A1 | 4/2012 | Luo et al. |
| 2013/0276980 A1 | 10/2013 | Lubomirsky et al. |
| 2013/0286533 A1 | 10/2013 | Takasaki et al. |
| 2014/0159325 A1 | 6/2014 | Parkhe et al. |
| 2014/0209245 A1 | 7/2014 | Yamamoto et al. |
| 2015/0036261 A1 | 2/2015 | Jindo et al. |
| 2015/0077895 A1 | 3/2015 | Jindo et al. |
| 2018/0119818 A1* | 5/2018 | Ide ........................ F16J 15/0825 |
| 2018/0306323 A1* | 10/2018 | Kinoshita ............ F16J 15/0818 |

OTHER PUBLICATIONS

"CIRLEX™ Thick Polyimide, H Types", MSDS No. CIR00001, Revised Oct. 8, 1996, printed Jan. 5, 1999, 6 pages.

\* cited by examiner

MULTI-ZONE GASKET FOR SUBSTRATE SUPPORT ASSEMBLY

TECHNICAL FIELD

Some embodiments of the present disclosure relate, in general, to a multi-zone gasket with multiple thermal conductivity profiles, and more particularly to a substrate support assembly that includes such a multi-zone gasket.

BACKGROUND

Substrate support assemblies such as electrostatic chucks are widely used to hold substrates (e.g., such as semiconductor wafers) during substrate processing in processing chambers used for various applications. Examples of processes include physical vapor deposition, etching, chemical vapor deposition, atomic layer deposition, cleaning, and so on.

Various processes used in the fabrication of integrated circuits may call for high temperatures and/or wide temperature ranges for substrate processing. However, substrate support assemblies in etch processes typically operate in a temperature range of up to about 120° C. At temperatures above about 120° C., the components of many electrostatic chucks will begin to fail due to various issues such as de-chucking, plasma erosion from corrosive chemistry, bond reliability, and so on.

Substrate support assemblies may include heating elements that have an optimal power setting. However, the heating elements in the substrate support assembly may operate outside of optimal power settings, which may contribute to temperature variation during processing.

SUMMARY

In one embodiment, a multi-zone gasket includes a top surface having a surface area. The gasket includes a plurality of zones that together define the surface area of the top surface. The plurality of zones includes a first zone comprising a first stack of gasket layers, the first zone having a first average thermal conductivity in a first direction. The plurality of zones additionally includes a second zone comprising one or more gasket layers, the second zone having a second average thermal conductivity in the first direction.

In one embodiment, a substrate support assembly comprises a ceramic plate, a cooling plate, and a multi-zone gasket between the ceramic plate and the cooling plate. The ceramic plate comprises a plurality of heating zones, wherein each of the plurality of heating zones comprises one or more heating elements. A top surface of the gasket contacts the ceramic plate and a bottom surface of the gasket contacts the cooling plate. The gasket comprises a plurality of zones that approximately align with the plurality of heating zones. The plurality of zones in the gasket includes a first zone comprising a first stack of gasket layers and a second zone comprising one or more gasket layers. The first zone has a first average thermal conductivity in a first direction and the second zone has a second average thermal conductivity in the first direction.

In one embodiment, a substrate support assembly comprises an electrostatic puck, a cooling plate coupled to the electrostatic puck, and a gasket compressed between the electrostatic puck and the cooling plate. The electrostatic puck comprises an electrically insulative upper puck plate comprising one or more heating elements and one or more electrodes to electrostatically secure a substrate, a lower puck plate bonded to the upper puck plate by a first metal bond, and an electrically insulative backing plate bonded to the lower puck plate by a second metal bond. The gasket comprises a plurality of zones, wherein a first zone of the plurality of zones comprises a first stack of gasket layers and has a first average thermal conductivity in a first direction, and wherein a second zone of the plurality of zones comprises one or more gasket layers and has second average thermal conductivity in the first direction.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
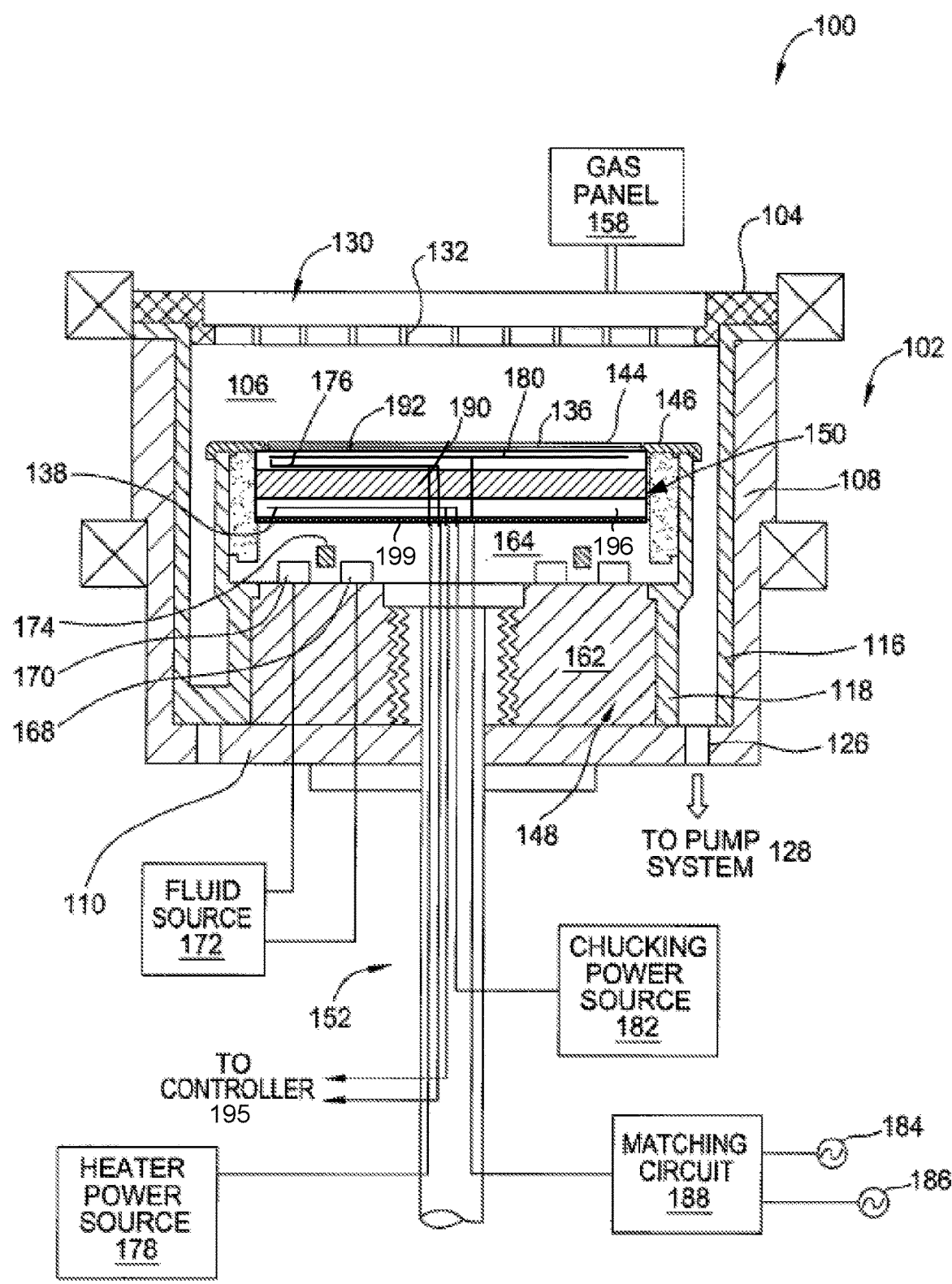
FIG. 1 depicts a sectional side view of one embodiment of a processing chamber.

Embodiments of the present disclosure provide a substrate support assembly and an electrostatic puck assembly capable of operating at temperatures of up to about 250° C. without incurring damage to the substrate support assembly. Embodiments also provide a multi-zone gasket that includes multiple different thermal conductivity profiles. The multi-zone gasket may be a multi-layer and multi-zone gasket. Each of the zones in the multi-layer, multi-zone gasket may have a different thermal conductivity profile that may be tailored for that particular zone. The multi-layer, multi-zone gasket may be used with the substrate support assembly described herein and/or may be used for other applications.

In one embodiment, an electrostatic puck assembly includes an electrically insulative upper puck plate bonded to a lower puck plate by a metal bond. The electrostatic puck assembly further includes a backing plate bonded to the lower puck plate by another metal bond. The metal bonds may be each be an aluminum bond, an AlSi alloy bond, or other metal bond. The upper puck plate includes one or more heating elements and one or more electrodes to electrostatically secure a substrate. The upper puck plate may be divided into multiple distinct heating zones, each of which may be independently heated to a distinct target temperature. The lower puck plate may include multiple features distributed over a bottom side of the lower puck plate at different distances from a center of the lower puck plate, where each of the features accommodates a fastener. The backing plate may include holes that provide access to the features in the lower puck plate.

The electrostatic puck assembly is a component in a substrate support assembly that further includes a cooling plate coupled to the electrostatic puck assembly (e.g., by the fasteners). The fasteners may each apply an approximately equal fastening force to couple the cooling plate to the electrostatic puck assembly. This approximately equal fastening force facilitates uniform heat transfer between the cooling plate and the electrostatic puck assembly.

The substrate support assembly may include a multi-layer, multi-zone gasket compressed between the electrostatic puck assembly and the cooling plate. The gasket may include a same number of zones as the number of heating zones in the upper puck plate of the electrostatic puck assembly. Each of the zones in the gasket may line up with one of the heating zones in the electrostatic puck assembly. The different zones of the gasket may include different stacks of gasket layers. Each stack of gasket layers may include one type or multiple different types of gasket layers that together define a thermal conductivity for that zone of the gasket.

Depending on the process or processes used on substrates supported by the substrate support assembly, the temperature profile may vary across the different heating zones. For example, plasma from a process may cause different heating zones to heat to different temperatures. Embodiments described herein enable the plasma power for a process to be increased without causing the heating elements to turn off. As a result, higher power plasma may be used in processes while enabling the heating elements to still be used, which provides thermal control of a processed substrate even while that substrate is exposed to higher plasma power.

In an example, a heating zone may have a target temperature of 120° C., and the plasma may cause the heating zone to reach 120° C. without turning on any heating elements in the heating zone. If the heating elements are not used, then there is limited to no control of the temperature in that heating zone. For example, if the plasma causes the heating zone to have a temperature that is above 120° C., the power of the heating elements in that heating zone cannot be reduced to bring the temperature back to the target temperature. However, if a gasket with a zone that has a high thermal conductivity is used to connect the heating zone to a cooling plate, then the cooling plate may cause the temperature of the heating zone to drop (e.g., down to 50-90° C.). The heating elements may then be turned on during processing to bring the temperature of the heating zone to the target 120° C. Since the heating elements are used to obtain this temperature, the power of the heating elements may be increased and/or decreased during processing as the temperature of the heating zone fluctuates to maintain the target temperature.

In embodiments, each of the zones in the multi-layer, multi-zone gasket has a thermal conductivity that is tailored for that zone in view of a process or processes that will be used in a chamber into which the gasket will be inserted. This may enable the heating elements in each heating zone of the electrostatic puck assembly to maintain a heater power of about 10%-90% of a maximum heater power. For example, if the maximum heater power was 1000 Watts, then 10-90% of the maximum heater power would be 100-900 Watts. In a further embodiment, the gasket may cause the heating elements to maintain a heater power of about 20%-80% of the maximum heater power, about 30%-70% of the maximum heater power, or about 40%-60% of the maximum heater power. By using a gasket with a unique tailored thermal conductivity for each zone, the heater power can be maintained at a target percentage of a maximum heater power for each zone even with different temperature profiles and/or plasma profiles across zones.

With regards to the electrostatic puck assembly, the upper puck plate may be composed of a dielectric such as AlN or $Al_2O_3$. The lower puck plate may be composed of a material that has a coefficient of thermal expansion that approximately matches the coefficient of thermal expansion of the material (e.g., $Al_2O_3$ or AlN) for the upper puck plate. The backing plate may be composed of the same material as the upper puck plate. Absent the use of a backing plate, the upper puck plate and lower puck plate may bow or warp due to forces caused by the bond between the upper puck plate and the lower puck plate. For example, the upper puck plate may have a convex bow of up to 300 microns. The bow may cause the electrostatic puck assembly to crack and/or may impair an ability of the electrostatic puck assembly to securely hold (e.g., chuck) a substrate such as a wafer. Additionally, the bow may cause delamination of a metal bond that secures the upper puck plate to the lower puck plate and may reduce an ability to create a vacuum seal.

Bonding the backing plate to a bottom of the lower puck plate may cause an approximately equal force to be applied to a top and bottom of the backing plate. By equalizing the forces on the top and bottom of the backing plate, a bow in the electrostatic puck assembly including the upper puck plate and the lower puck plate may be nearly eliminated. For example, a bow in the electrostatic puck assembly may be reduced from about 0.3 mm to less than 0.1 mm (e.g., about 0.05 mm or 50 microns or less in embodiments). The reduction in the bow of the electrostatic puck assembly may improve an ability of the electrostatic puck assembly to secure substrates, may reduce or eliminate cracking, may improve a seal between the upper puck plate and a supported substrate and may improve a vacuum seal of the electrostatic puck assembly. In one embodiment, the forces (internal stress) on the upper puck plate are about −98+/−7 Megapascals (MPa), the forces on the backing plate are about −136+/−5 MPa, the forces on the top face of the lower puck plate are about 80 MPa and the forces on the bottom face of the lower puck plate are about 54 MPa. A positive value represents a compressive force and a negative value represents a tensile force.

FIG. 1 is a sectional view of one embodiment of a semiconductor processing chamber 100 having a multi-layer electrostatic puck assembly 150 and a multi-layer, multi-zone gasket 199 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases that may be used to process substrates in the processing chamber include halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$ or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of a substrate 144. Additionally, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

An inner liner 118 may be coated on the periphery of a substrate support assembly 148. The inner liner 118 may be a halogen-containing gas resist material such as those discussed with reference to the outer liner 116. In one embodiment, the inner liner 118 may be fabricated from the same materials of the outer liner 116.

The substrate support assembly 148 is disposed in the interior volume 106 of the processing chamber 100 below the gas distribution assembly 130. The substrate support assembly 148 includes the electrostatic puck assembly 150 (also referred to as an electrostatic puck or multilayer stack). The electrostatic puck assembly 150 holds the substrate 144 during processing. The electrostatic puck assembly 150 described in embodiments may be used for Johnsen-Rahbek and/or Coulombic electrostatic chucking.

The electrostatic puck assembly 150 includes an upper puck plate 192, a lower puck plate 190 and a backing plate 196. The upper puck plate 192 may be bonded to the lower puck plate 190 by a first metal bond, and the lower puck plate 190 may be bonded to the backing plate 196 by a second metal bond. The upper puck plate 192 may be a dielectric or electrically insulative material that is usable for semiconductor processes at temperatures of 200° C. and above. In one embodiment, the upper puck plate 192 is composed of materials usable from about 20° C. to about 500° C. In one embodiment, the upper puck plate 192 is AlN or $Al_2O_3$.

The lower puck plate 190 may have a coefficient of thermal expansion that is matched (or approximately matched) to a coefficient of thermal expansion of the upper puck plate 192 and/or backing plate 196. In one embodiment, the lower puck plate 190 is a SiC porous body that is infiltrated with an AlSi alloy (referred to as AlSiSiC). The AlSiSiC material may be used, for example, in reactive etch environments. In another embodiment, the lower puck plate 190 is a metal matrix composite of Si, SiC and Ti (SiSiCTi). Alternatively, the lower puck plate 190 may be Molybdenum. AlN may have a coefficient of thermal expansion of about 4.5-5 parts per million per degrees C. (ppm/° C.). AlSiSiC may have a coefficient of thermal expansion of around 5 ppm/° C. Molybdenum may have a coefficient of thermal expansion of about 5.5 ppm/° C. Accordingly, in one embodiment, the upper puck plate 192 and backing plate 196 are AlN and the lower puck plate 190 is Molybdenum or AlSiSiC. A metal matrix composite of SiSiCTi may have a coefficient of thermal expansion of about 8 ppm/° C. $Al_2O_3$ may have a coefficient of thermal expansion of about 8 ppm/° C. Accordingly, in one embodiment having an $Al_2O_3$ upper puck plate, an SiSiCTi lower puck plate, and an $Al_2O_3$ backing plate, the coefficient of thermal expansion for the lower puck plate 190, the upper puck plate 192 and the backing plate 196 may all be about 8 ppm/° C.

In one embodiment, the upper puck plate 192 is coated with a protective layer 136, which may be a plasma resistant ceramic coating. The protective layer 136 may also coat a vertical wall of the upper puck plate 192, a metal bond between the upper puck plate 192 and lower puck plate 190, the backing plate 196, and/or the metal bond between the lower puck plate 192 and the backing plate 196. The protective layer 136 may be a bulk ceramic (e.g., a ceramic wafer), a plasma sprayed coating, a coating deposited by ion assisted deposition (IAD), or a coating deposited using other deposition techniques. The protective layer 136 may be $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride), Sialon, (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in an $Al_2O_3$ matrix, a $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The substrate support assembly 148 further includes a cooling plate 164, which is coupled to the backing plate 196. The cooling plate 164 is a thermally conductive base that may act as a heat sink. In one embodiment, the cooling plate 164 is coupled to the electrostatic puck assembly 150 by multiple fasteners.

The substrate support assembly 148 further includes a multi-layer, multi-zone gasket 199 between the electrostatic puck assembly 150 and the cooling plate 164. The electrostatic puck assembly 150 may include multiple different heating zones. The gasket 199 may also include multiple zones, where each of the zones in the gasket 199 may align with (or approximately align with) a corresponding heating zone in the electrostatic puck assembly 150. Each of the zones in the gasket 199 may have a thermal conductivity that is tailored for that zone. This may include a tailored thermal conductivity in an x-y plane defined by the gasket and/or a tailored thermal conductivity in a z-direction that is orthogonal to the x-y plane.

In one embodiment, the substrate support assembly 148 additionally includes a mounting plate 162 and a pedestal 152. The mounting plate 162 is coupled to the bottom 110 of the chamber body 102 and includes passages for routing utilities (e.g., fluids, power lines, sensor leads, etc.) to the cooling plate 164 and the electrostatic puck assembly 150. The cooling plate 164 and/or electrostatic puck assembly 150 may include one or more optional embedded heating elements 176, optional embedded thermal isolators 174 and/or optional conduits 168, 170 to control a lateral temperature profile of the substrate support assembly 148.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The conduits 168, 170 and embedded heating elements 176 may be utilized to control the temperature of the electrostatic puck assembly 150, thereby heating and/or cooling the electrostatic puck assembly 150 and the substrate 144 (e.g., a wafer) being processed.

In one embodiment, the electrostatic puck assembly 150 includes two separate heating zones that can maintain distinct temperatures. In another embodiment, the electrostatic puck assembly 150 includes four different heating zones that can maintain distinct temperatures. Other numbers of heating zones may also be used. The temperature of the electrostatic puck assembly 150 and the cooling plate 164 may be monitored using one or more temperature sensors 138, which may be monitored using a controller 195. Embodiments enable the electrostatic puck assembly 150 to maintain temperatures of up to about 250° C. while the cooling base maintains a temperature of about 60° C. Accordingly, embodiments enable a temperature delta of up to about 190° C. to be maintained between the electrostatic puck assembly 150 and the cooling plate 164.

The electrostatic puck assembly 150 may further include multiple gas passages such as grooves, mesas and other surface features, that may be formed in an upper surface of the upper puck plate 192. The gas passages may be fluidly coupled to a source of a heat transfer (or backside) gas such as He via holes drilled in the upper puck plate 192. In operation, the backside gas may be provided at controlled pressure into the gas passages to enhance the heat transfer between the upper puck plate 192 and the substrate 144.

In one embodiment, the upper puck plate 192 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
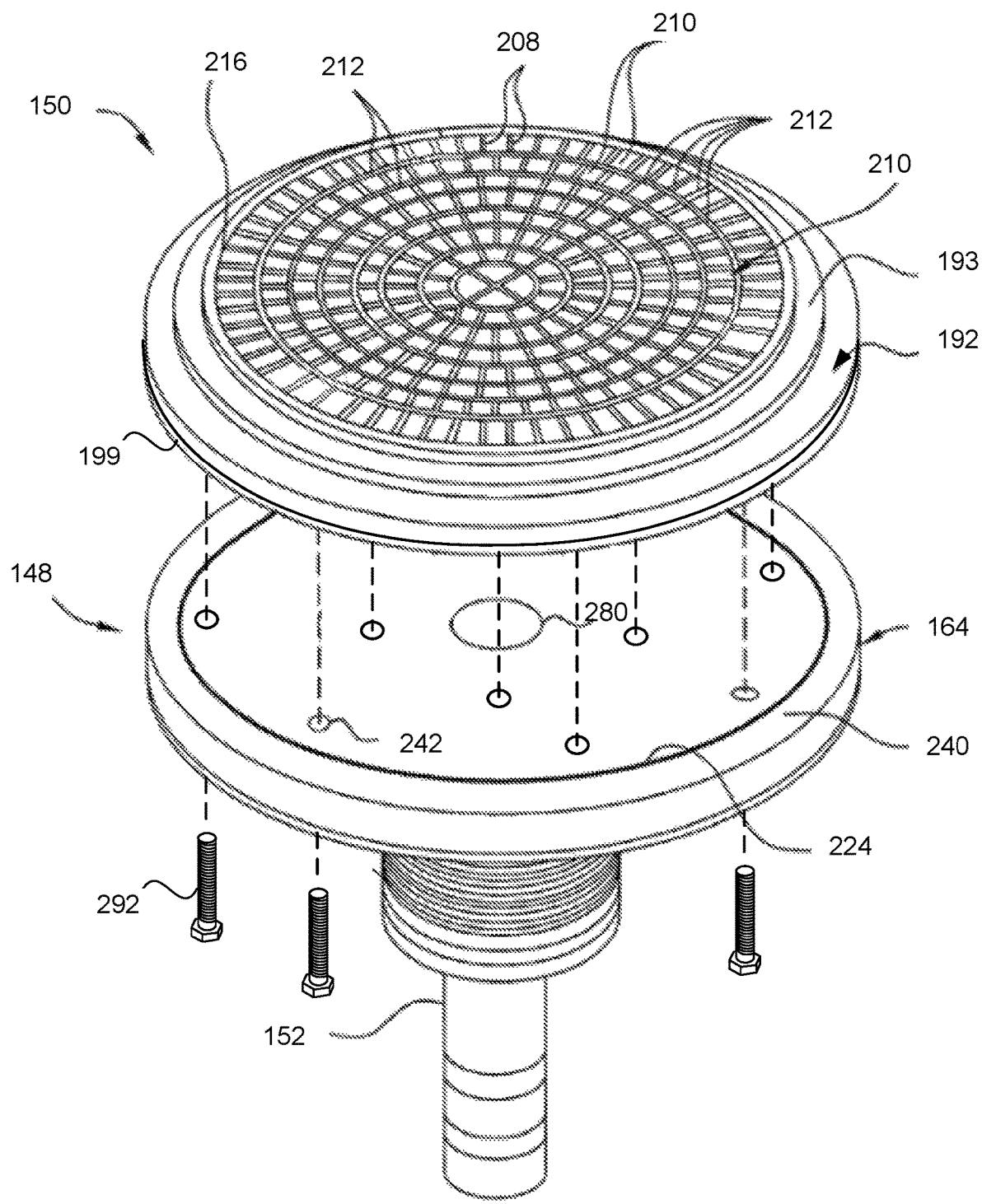
FIG. 2 depicts an exploded view of one embodiment of a substrate support assembly.

FIG. 2 depicts an exploded view of one embodiment of the substrate support assembly 148, including the electrostatic puck assembly 150, the cooling plate 164, the multi-layer, multi-zone gasket 199 and the pedestal 152. The electrostatic puck assembly 150 includes the upper puck plate 192, as well as the lower puck plate (not shown) and the backing plate (not shown). As shown, an o-ring 240 may also be disposed on the cooling plate 164 along a perimeter of a top side of the cooling plate 164 in some embodiments. In one embodiment, the o-ring 240 is vulcanized to the cooling plate 164. Alternatively, the o-ring 240 may be disposed on the top side of the cooling plate 164 without being vulcanized thereto.

The gasket 199 may multiple zones, each of which may be made up of multiple gasket layers of various materials. Alternatively, some zones may include a single gasket layer. Examples of materials that may be used to form gasket layers include grafoil, polyimide, fluoropolymers (e.g., perfluoropolymers (PFPs)), metals (e.g., metal foils such as aluminum foil, gold foil, copper foil, etc.), rubber, silicone, and so on. Examples of PFPs usable for gasket layers in one or more zones in the gasket 299 are Dupont's™ ECC-treme™, Dupont's KALREZ® (e.g., KALREZ 8900) and Daikin's® DUPRA™. Examples of polyimides that may be used for gasket layers in one or more zones in the gasket 299 are Cirlex® and Kapton®. Different types of grafoil may be used for various gasket layers of the gasket 299. Grafoil may have a thermal conductivity of around 100-1200 Watts per meter Kelvin (W/m·K) in the x-y plane (e.g., around 140-800 W/m·K) and may have a thermal conductivity of around 5-150 W/m·K in the z-direction (orthogonal to the x-y plane). Grafoil may be selected that has a target thermal conductivity in the x-y plane and in the z-direction.

In one embodiment, the gasket 199 includes a first zone made up of a first stack of gasket layers with a first number of gasket layers and a second zone made up a second stack of gasket layers with a second number of gasket layers. The gasket 199 may additionally include more than two zones. For example, the gasket 199 may include a third zone, a fourth zone, a fifth zone, a sixth zone, and so on. Each zone may have a tailored gasket layer stack with a distinct average thermal conductivity in a particular direction (e.g., the z-direction).

In one embodiment, one or more gasket layers in the first gasket layer stack may be composed of a first material that is not present in any gasket layers of the second gasket layer stack. In one embodiment, a thickness of the gasket 199 and of each gasket layer stack may be about 0.2-2.0 mm. In one embodiment, a top layer and/or a bottom layer of each gasket layer stack is composed of grafoil. In one embodiment, one or more intermediate gasket layers in the first gasket layer stack and the second gasket layer stack include a metal, polyimide, silicone, rubber, and/or a fluoropolymer. In one embodiment, each gasket layer has a thickness of about 3 mils to the thickness of the gasket 199.

In one embodiment, the o-ring 240 is a perfluoropolymer (PFP) o-ring. Alternatively, other types of high temperature o-rings may be used, such as polyimide o-rings. In one embodiment, thermally insulating high temperature o-rings are used. The o-ring 240 may be a stepped o-ring having a first step at a first thickness and a second step at a second thickness. This may facilitate uniform tightening of fasteners by causing the amount of force used to tighten the fasteners to increase dramatically after a set amount of compression of the PFP o-ring 240.

Additional o-rings (not shown) may also be attached to the top side of the cooling plate around a hole 280 at a center of the cooling plate 164 through which cables are run. Other smaller o-rings may also be attached to the cooling plate 164 around other openings, around lift pins, and so forth. The o-ring 240 and/or gasket 199 provide a vacuum seal between a chamber interior volume and interior volumes within the electrostatic puck assembly 150. The interior volumes within the electrostatic puck assembly 150 include open spaces within the pedestal 152 for routing conduits and wiring.

In one embodiment, the cooling plate 164 additionally includes numerous features 242 through which fasteners are inserted. If a gasket is used, the gasket may have cutouts at each of the features 242. Fasteners may extend through each of the features 242 and attach to additional portions of the fasteners (or additional fasteners) that are inserted into additional features formed in the lower puck plate. For example, a bolt may extend through a feature 242 in the cooling plate 164 and be screwed into a nut disposed in a feature of the lower puck plate. Each feature 242 in the cooling plate 164 may line up to a similar feature (not shown) in the lower puck plate.

The upper puck plate 192 has a disc-like shape having an annular periphery that may substantially match the shape and size of a substrate positioned thereon. An upper surface of the upper puck plate 192 may have an outer ring 216, multiple mesas 210 and channels 208, 212 between the mesas 210. The upper puck plate 192 may also have additional features such as step 193. In one embodiment, the upper puck plate 192 may be fabricated by an electrically insulative ceramic material. Suitable examples of the ceramic materials include aluminum nitride (AlN), aluminum oxide ($Al_2O_3$), and the like.

The cooling plate 164 attached below the electrostatic puck assembly 150 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the electrostatic puck assembly 150. The cooling plate 164 should provide good strength and durability as well as heat transfer properties.

Figure 3:
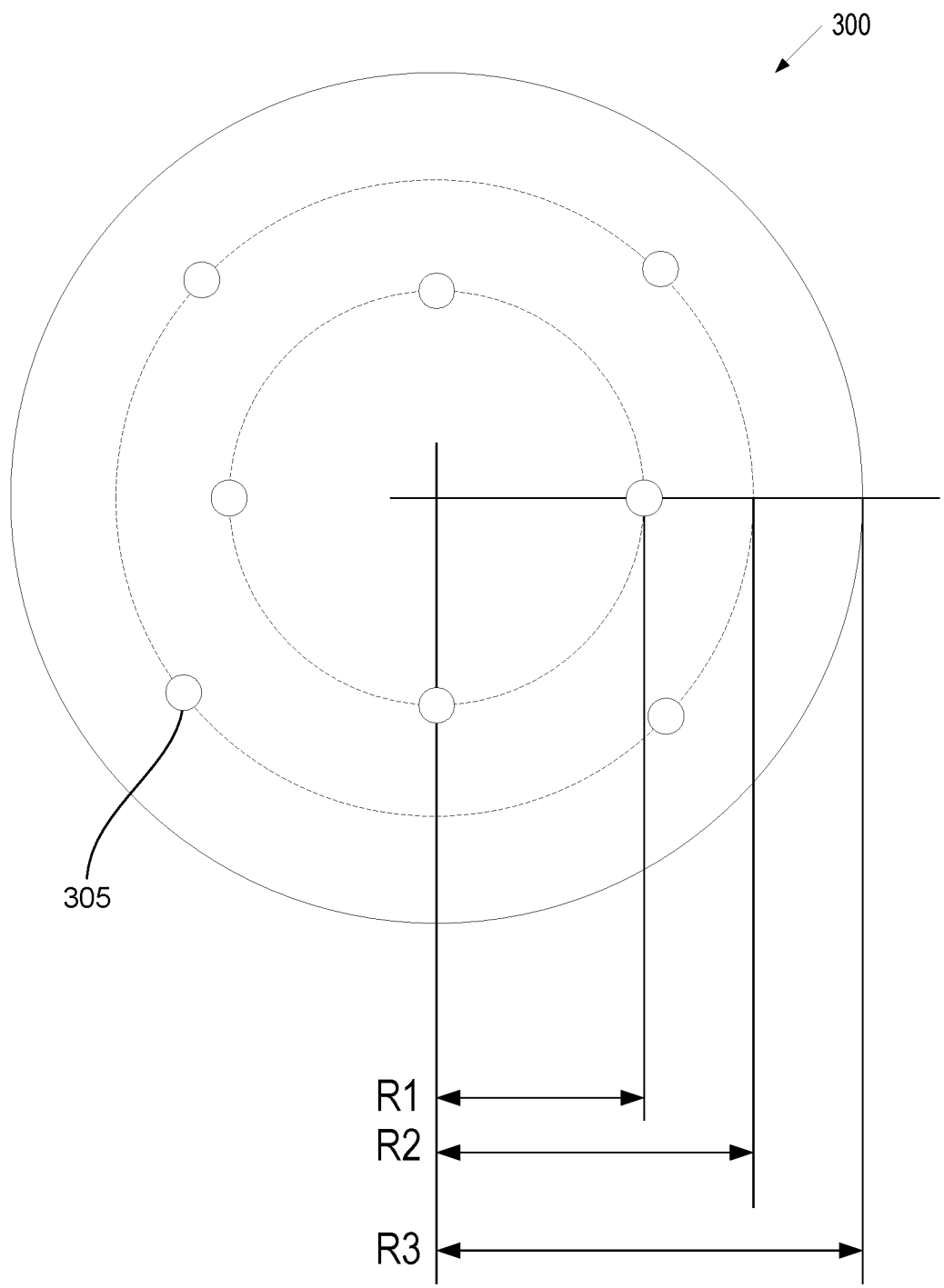
FIG. 3 depicts a sectional top view of one embodiment of an electrostatic puck assembly.

FIG. 3 depicts a top view of one embodiment of a lower puck plate 300 used in an electrostatic puck assembly. Lower puck plate 300 may correspond to lower puck plate 190, or any other lower puck plate described herein. As shown, the lower puck plate 300 has a radius R3, which may be substantially similar to a radius of substrates or wafers that are to be supported by the electrostatic puck assembly. The lower puck plate 300 additionally includes multiple features 305. The features may match similar features in a cooling plate to which an electrostatic puck assembly including the lower puck plate 300 is mounted. Each feature 305 accommodates a fastener. For example, a bolt (e.g., a stainless steel bolt, galvanized steel bolt, etc.) may be placed into each feature such that a head of the bolt is inside of an opening large enough to accommodate the head and a shaft of the bolt extends out of a bottom side of the lower puck plate 300. The bolt may be tightened onto a nut that is placed in a corresponding feature in the cooling plate. Alternatively, features 305 may be sized to accommodate a nut, and may include a hole that can receive a shaft of a bolt that is accommodated by a corresponding feature in the cooling plate. In another example, a helical insert (e.g., a Heli-Coil®) or other threaded insert (e.g., a press fit insert, a mold-in insert, a captive nut, etc.) may be inserted into one or more of the features to add a threaded hole thereto. A bolt placed inside of the cooling plate and protruding from the cooling plate may then be threaded into the threaded insert to secure the cooling plate to the puck. Alternatively, threaded inserts may be used in the cooling plate.

The features 305 may be slightly oversized as compared to a size of the fasteners to accommodate a greater coefficient of thermal expansion of the fasteners. In one embodiment, the fasteners are sized such that the fasteners will not exert a force on the features when the fasteners are heated to 500 or 600 degrees Celsius.

As shown, multiple sets of features 305 may be included in the lower puck plate 300. Each set of features 305 may be evenly spaced at a particular radius or distance from a center of the lower puck plate. For example, as shown a first set of features 305 is located at a radius R1 and a second set of features 305 is located at a radius R2. Additional sets of features may also be located at additional radiuses.

In one embodiment, the features are arranged to create a uniform load on the electrostatic puck assembly including the lower puck plate 300. In one embodiment, the features are arranged such that a bolt is located approximately every 30-70 square centimeters (e.g., every 50 square centimeters). In one embodiment, three sets of features are used for a 12 inch diameter electrostatic puck assembly. A first set of features may be located about 4 inches from a center of the lower puck plate 300 and includes about 4 features. A second set of features may be located about 6 inches from a center of the lower puck plate 300 and includes about 6 features. A third set of features may be located about 8 inches from a center of the lower puck plate 300 and includes about 8 features. Alternatively, two sets of features may be used. In one embodiment, the lower puck plate 300 includes about 8-24 features arranged in sets at 2-3 different radiuses, where each feature accommodates a fastener.

Figure 4A:
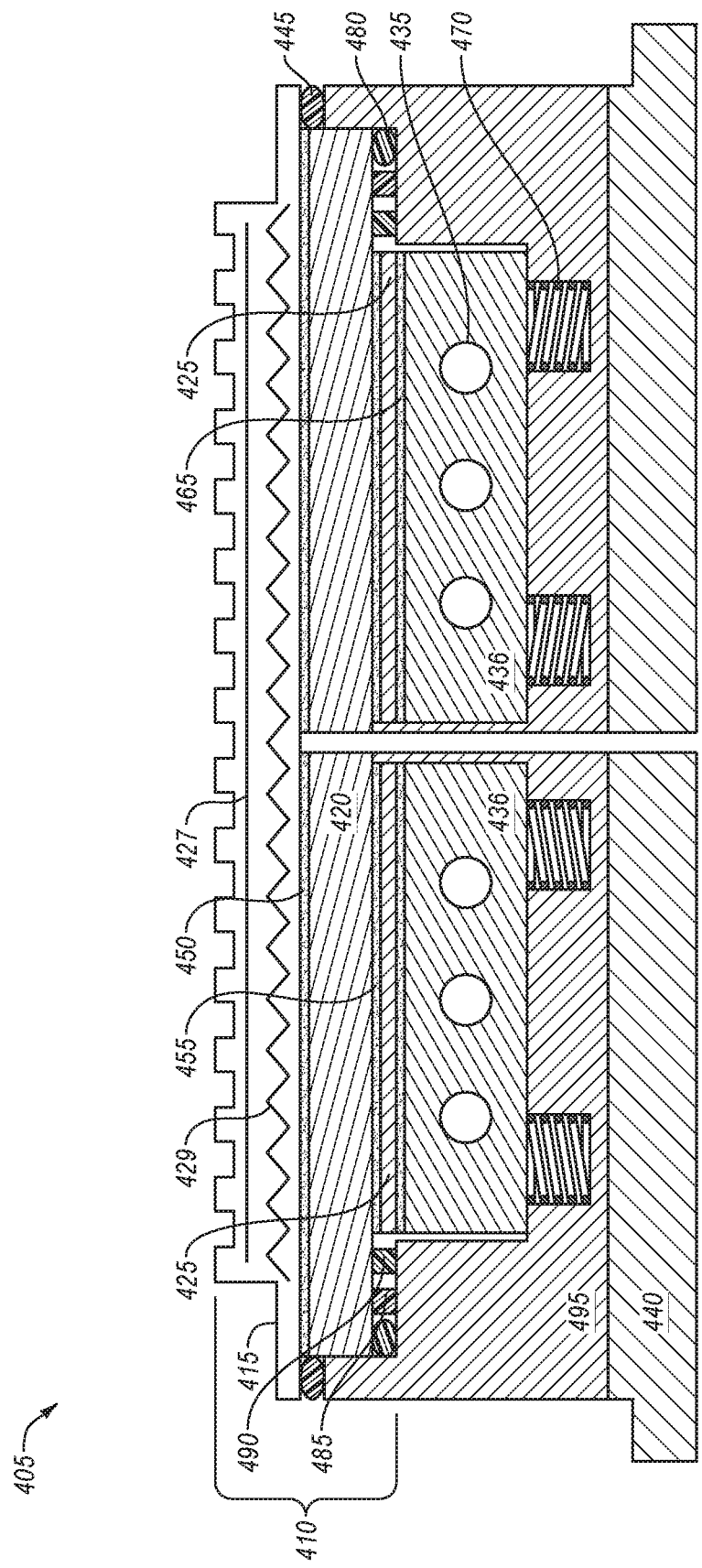
FIG. 4A depicts a sectional side view of one embodiment of a substrate support assembly.

FIG. 4A depicts a sectional side view of one embodiment of a substrate support assembly 405. The substrate support assembly 405 includes an electrostatic puck assembly 410 made up of an upper puck plate 415, a lower puck plate 420 and a hacking plate 425 that may be bonded together by metal bonds. In one embodiment, the upper puck plate 415 is bonded to the lower puck plate 420 by a first metal bond 450 and the lower puck plate 420 is bonded to the backing plate 425 by a second metal bond 455. In one embodiment, diffusion bonding is used as the method of metal bonding. However, other bonding methods may also be used to produce the metal bonds.

The upper puck plate 415 is composed of an electrically insulative (dielectric) ceramic such as AlN or $Al_2O_3$. In one embodiment, the backing plate 425 is composed of the same material as the upper puck plate 415. This may cause approximately matching but opposite forces on the lower puck plate 420 by the upper puck plate 415 and the backing plate 425. The approximately matching forces may minimize or eliminate bowing and cracking of the upper puck plate 415.

The upper puck plate 415 includes clamping electrodes 427 and one or more heating elements 429. The clamping electrodes 427 may be coupled to a chucking power source (not shown), and to an RF plasma power supply (not shown) and an RE bias power supply (not shown) via a matching circuit (not shown). The heating elements 429 are electrically connected to a heater power source (not shown) for heating the upper puck plate 415.

The upper puck plate 415 may have a thickness of about 3-10 mm. In one embodiment, the upper puck plate 415 has a thickness of about 3-5 mm. The clamping electrodes 427 may be located about 0.3 to 1 mm from an upper surface of the upper puck plate 415, and the heating elements 429 may be located about 2 mm under the clamping electrodes 427. The heating elements 429 may be screen printed heating elements having a thickness of about 10-200 microns. Alternatively, the heating elements 429 may be resistive coils that use about 1-3 ram of thickness of the upper puck plate 415. In such an embodiment, the upper puck plate 415 may have a minimum thickness of about 5 mm.

In one embodiment, the backing plate 425 has a thickness that is approximately equal to the thickness of the upper puck plate 415. For example, the upper puck plate 415 and the backing plate 425 may each have a thickness of about 3-5 mm in an embodiment. In one embodiment, the backing plate 425 has a thickness of about 3-10 mm.

In one embodiment, the lower puck plate 420 has a thickness that is equal to or greater than the thickness of the upper puck plate 415 and the backing plate 425. In one embodiment, the lower puck plate 420 has a thickness of about 8-25 mm. In one embodiment, the lower puck plate 420 has a thickness that is about 30%-330% greater than the thickness of the upper puck plate 415.

In one embodiment, the material used for the lower puck plate 420 may be suitably chosen so that a coefficient of thermal expansion (CTE) for the lower puck plate 420 material substantially matches the CTE of the electrically insulative upper puck plate 415 material in order minimize CTE mismatch and avoid thermo mechanical stresses which may damage the electrostatic puck assembly 410 during thermal cycling.

In one embodiment, the lower puck plate 420 is Molybdenum. Molybdenum may be used for the lower puck plate 420, for example, if the electrostatic puck assembly 410 is to be used in an inert environment. Examples of inert environments include environments in which inert gases such as Ar, O2, N, etc. are flowed. Molybdenum may be used, for example, if the electrostatic puck assembly 410 is to chuck a substrate for metal deposition. Molybdenum may also be used for the lower puck plate 420 for applications in a corrosive environment (e.g., etch applications). In such an embodiment, exposed surfaces of the lower puck plate 420 may be coated with a plasma resistant coating after the lower puck plate 420 is bonded to the upper puck plate 415. The plasma coating may be performed via a plasma spray process. The plasma resistant coating may cover, for example, side walls of the lower puck plate and an exposed horizontal step of the lower puck plate 420. In one embodiment, the plasma resistant coating is $Al_2O_3$. Alternatively, the plasma resistant coating may be any of the materials described with reference to protective layer 136 above.

In one embodiment, an electrically conductive metal matrix composite (MMC) material is used for the lower puck plate 420. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the lower puck plate 420 is preferably chosen to provide a desired electrical conductivity and to substantially match the CTE of the upper puck plate 415 material over the operating temperature range for the electrostatic puck assembly 410. In one embodiment, the temperature may range from about 20° Celsius to about 5000 Celsius. In one embodiment, matching the CTEs is based on selecting the MCC material so that the MCC material includes at least one material which is also used in the upper puck plate 415 material. In one embodiment, the upper puck plate 415 includes AlN. In one embodiment, the MMC material includes a SiC porous body that is infiltrated with an AlSi alloy (referred to herein as AlSiSiC).

The constituent materials and composition percentages of the MMC may be selected to provide an engineered material which meets desirable design objectives. For example, by suitably selecting the MCC material to closely match the CTEs of the lower puck plate 420 and upper puck plate 415, the thermo-mechanical stresses at an interface between the lower puck plate 420 and the upper puck plate 415 are reduced.

By matching coefficients of thermal expansion between the layers of the electrostatic puck assembly 410, stress caused by bonding the lower puck plate 420 to the upper puck plate 415 and the backing plate 425 may be minimized. In one embodiment, the lower puck plate 420 is composed of a metal matrix composite material as described above. Alternatively, the lower puck plate 420 may be SiSiCTi or Molybdenum.

In one embodiment, the lower puck plate 420 has a roughened outer wall that has been coated with a plasma resistant ceramic coating (not shown). Plasma resistant ceramic coatings are discussed in greater detail below with reference to FIGS. 5A-5B.

In one embodiment, the upper puck plate 415, the lower puck plate 420 and the backing plate 425 comprise materials which include aluminum. For example, the upper puck plate 415 and backing plate 425 may each be composed of $Al_2O_3$ or AlN and the lower puck plate 420 may be composed of AlSiSiC.

Metal bond 450 may include an "interlayer" of aluminum foil that is placed in a bonding region between the upper puck plate 415 and the lower puck plate 420. Similarly metal bond 455 may include an interlayer of aluminum foil that is placed in a bonding region between the lower puck plate 420 and the backing plate 425. Pressure and heat may be applied to form a diffusion bond between the aluminum foil and the upper puck plate 415 and between the aluminum foil and lower puck plate 420. Similarly, pressure and heat may be applied to form a diffusion bond between the aluminum foil and the lower puck plate 420 and between the aluminum foil and the backing plate 425. In other embodiments, the diffusion bonds may be formed using other interlayer materials which are selected based upon the materials used for upper puck plate 415, the lower puck plate 420 and the backing plate 425. In one embodiment, the metal bonds 450, 455 have a thickness of about 0.2-0.3 mm.

In one embodiment, the upper puck plate 415 may be directly bonded to the lower puck plate 420 using direct diffusion bonding in which no interlayer is used to form the bond. Similarly, the lower puck plate 420 may be directly bonded to the backing plate 425 using direct diffusion bonding.

The upper puck plate 415 may have a diameter that is larger than a diameter of the lower puck plate 420 and the backing plate 425. In one embodiment, the upper puck plate 415 and the lower puck plate 420 each has a diameter of about 300 mm and the backing plate 425 has a diameter of about 250 mm. In one embodiment, the backing plate 425 has a diameter that is approximately 75-85% of the diameter of the upper puck plate 415. An edge of a base plate 495 may have a similar diameter to the diameter of the upper puck plate 415. A plasma resistant and high temperature o-ring 445 may be disposed between upper puck plate 415 and the base plate 495. This o-ring 445 may provide a vacuum seal between an interior of the substrate support assembly and a processing chamber. The o-ring 445 may be made of a perfluoropolymer (PFP), a fluoropolymer, a polyimide, and so on. In one embodiment, the o-ring 445 is a PFP with inorganic adders such as SiC. The o-ring 445 may be replaceable. When the o-ring 445 degrades it may be removed and a new o-ring may be stretched over the upper puck plate 415 and placed at a perimeter of the upper puck plate 415 at an interface between the upper puck plate 415 and the base plate 495. The o-ring 445 may protect the metal bonds 450, 455 from erosion by plasma.

The backing plate 425 is coupled to and in thermal communication with a cooling plate 436 having one or more conduits 435 (also referred to herein as cooling channels) in fluid communication with a fluid source (not shown). The lower puck plate 420 and/or backing plate 425 may include numerous features (not shown) for receiving fasteners. In one embodiment, the cooling plate 436 and/or base plate 495 are coupled to the electrostatic puck assembly 410 by multiple fasteners (not shown). The fasteners may be threaded fasteners such as nut and bolt pairs. The lower puck plate 420 may include multiple features (not shown) for accommodating the fasteners. The cooling plate 436 may likewise include multiple features (not shown) for accommodating the fasteners. Additionally, the base plate 495 may include multiple features (not shown) for accommodating the fasteners. In one embodiment, the features are bolt holes with counter bores. The features may be through features that extend through the lower puck plate 420 and backing plate 425. Alternatively, the features may not be through features. In one embodiment, the features are slots that accommodate a t-shaped bolt head or rectangular nut that may be inserted into the slot and then rotated 90 degrees. In one embodiment, the fasteners include washers, graphoil, aluminum foil, or other load spreading materials to distribute forces from a head of the fastener evenly over a feature.

The cooling plate 436 may act as a heat sink to absorb heat from the electrostatic puck assembly 410. In one embodiment (as shown), a multi-layer, multi-zone gasket 465 is disposed on the cooling plate 436. The gasket 465 may have multiple different zones, each of which may have a different average thermal conductivity in at least one direction. The gasket 465 may be vulcanized to or otherwise disposed on the cooling plate 436. In one embodiment, each zone in the gasket 465 has a thermal conductivity of between about 0.2 W/(m·K) to about 150 W/(m·K). One or more of the zones in the gasket 465 may have a different number of gasket layers, different materials in one or more of the gasket layers, a different average thermal conductivity in the z-direction (i.e., the direction that represents the thickness of the gasket 465), and/or a different thermal conductivity in the x-y plane for one or more of the gasket layers. The gasket 465 may correspond to gasket 199 in embodiments. The fasteners may be tightened to compress the gasket 465. The fasteners may be tightened with approximately the same force to evenly compress the low thermal conductivity gasket 465. One or more zones of the gasket 465 may decrease heat transfer and act as a thermal choke and/or increase thermal conductivity and act as a thermal conduit. Some zones may act as thermal chokes while other zones may act as thermal conduits.

In one embodiment, one or more o-rings (not shown) may be disposed at an outer perimeter and/or an inner perimeter of the cooling plate 164. The o-ring(s) may be used in addition to the gasket 465. The fasteners may all be tightened with approximately the same force to compress the o-ring(s) and/or gasket and cause a distance between the backing plate 425 of the electrostatic puck assembly 410 and the cooling plate 436 to be approximately uniform. The distance may be approximately the same (uniform) throughout the interface between the backing plate 425 and the cooling plate 436. This ensures that the heat transfer properties between the cooling plate 436 and the backing plate 425 are uniform within a particular zone of the gasket 465.

The electrostatic puck assembly 410 may be maintained at much greater temperatures than the cooling plate 436 in embodiments. For example, in some embodiments the electrostatic puck assembly 410 may be heated to temperatures of 200-300 degrees Celsius, while the cooling plate 436 may maintain a temperature of below about 120 degrees Celsius. In one embodiment, the electrostatic puck assembly 410 may be heated up to a temperature of about 250° C. while maintaining the cooling plate 436 at a temperature of about 60° C. or below. Accordingly, up to a 190° C. may be maintained between the electrostatic puck assembly 410 and the cooling plate 436 in embodiments. The electrostatic puck assembly 410 and the cooling plate 436 are free to expand or contract independently during thermal cycling.

In some zones, the gasket 465 may have a low thermal conductivity (e.g., below about 2 W/m·K) and function as a thermal choke by restricting the heat conduction path from the heated electrostatic puck assembly 410 to the cooled cooling plate 436. To provide efficient heating of the substrate, it may be desirable to limit the amount of heat conducted away from the upper puck plate 415 for some zones of the gasket 465. In other zones, the gasket 465 may have a medium thermal conductivity (e.g., about 2-20 W/m·K). In still other zones, the gasket 465 may have a high thermal conductivity (e.g., anywhere from 20-150 W/m·K).

In one embodiment, the cooling plate 436 is coupled to the base plate 495 by one or more springs 470. In one embodiment, the springs 470 are coil springs. The springs 470 apply a force to press the cooling plate 436 against the electrostatic puck assembly 410. A surface of the cooling plate 436 may have a predetermined roughness and/or surface features (e.g., mesas) that affect heat transfer properties between the electrostatic puck assembly 410 and the cooling plate 436. Additionally, the material of the cooling plate 436 may affect the heat transfer properties. For example, an aluminum cooling plate 436 will transfer heat better than a stainless steel cooling plate 436.

In some embodiments it may be desirable to provide an RF signal through the electrostatic puck assembly 410 and to a supported substrate during processing. In one embodiment, to facilitate the transmission of such an RF signal through the electrostatic puck assembly 410, an RF gasket 490 is disposed on the base plate 495. The RF gasket 490 may electrically connect the base plate 495 to the lower puck plate 420, thus providing a conductive path past the backing plate 425. Due to the position of the RF gasket 490, a diameter of the backing plate 425 may be smaller than a diameter of the lower puck plate 420 and a diameter of the upper puck plate 415.

In one embodiment, a thermal spacer 485 is disposed adjacent to the RF gasket 490. The thermal spacer 485 may be used to ensure that the base plate 295 will not come into contact with the lower puck plate 420. In one embodiment, an o-ring 480 is disposed adjacent to the thermal spacer 485. The o-ring 480 may be a PFP o-ring, polyimide o-ring, or other type of o-ring in embodiments. The o-ring 480 may be used to facilitate a vacuum seal. In one embodiment, a mounting plate 440 is disposed beneath and coupled to the base plate 495.

Figure 4B:
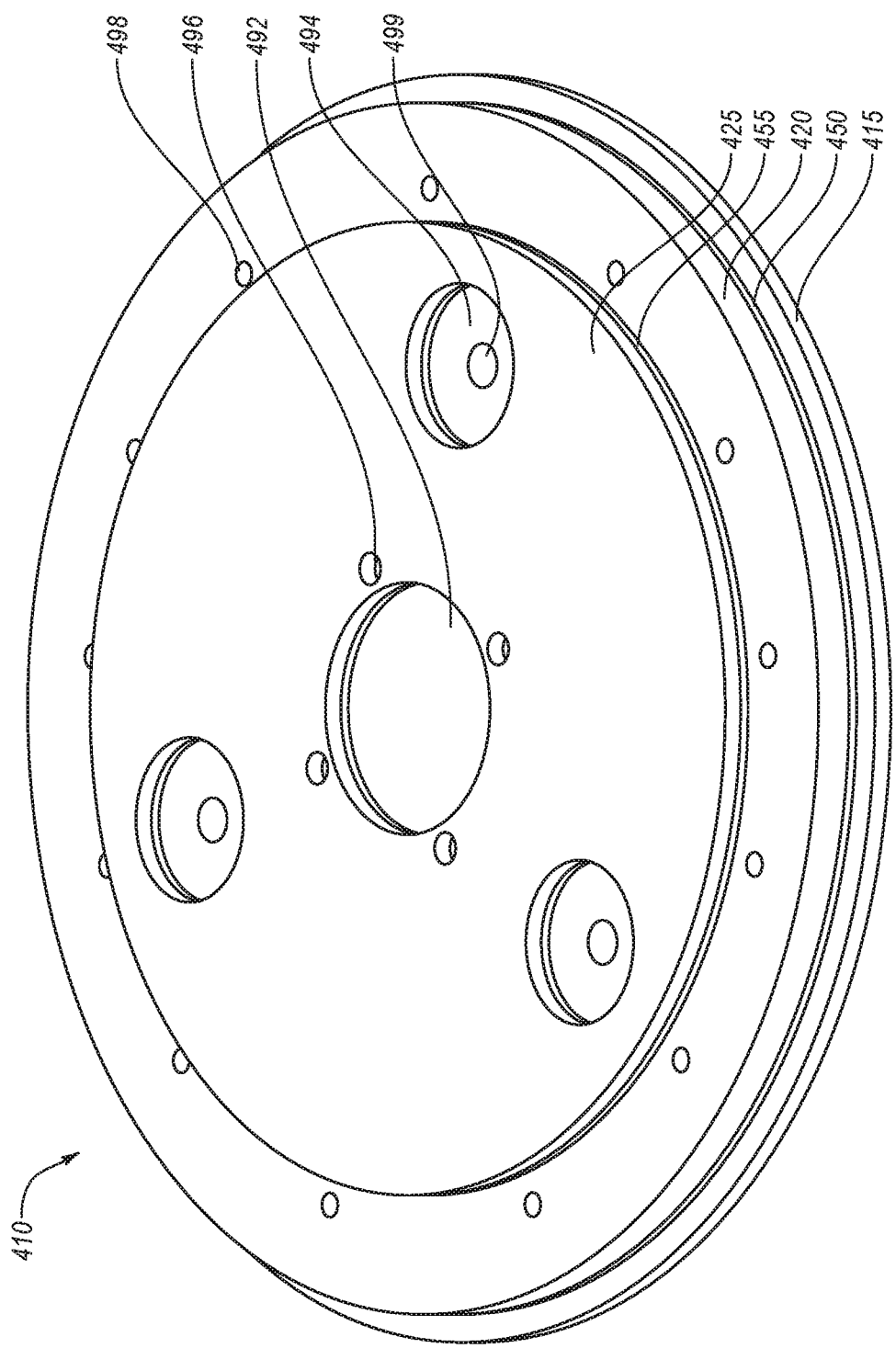
FIG. 4B depicts a perspective view of one embodiment of an electrostatic puck assembly.

FIG. 4B depicts a perspective view of one embodiment of a bottom of electrostatic puck assembly 410 shown in FIG. 4A. As illustrated, the upper puck plate 415 has a first diameter that is larger than a second diameter of the lower puck plate 420. The backing plate 425 has a third diameter that is smaller than the second diameter of the lower puck plate 420. As mentioned previously with reference to FIG. 4A, the backing plate 425 may have a smaller diameter than the lower puck plate 420 to provide space for an RF gasket. Additionally, the lower puck plate 420 may include multiple inner features (not shown) and multiple outer features 498 that are to receive fasteners as described with reference to FIGS. 2-4A. The backing plate 425 may be sized such that the backing plate 425 does not block the outer features 498. The backing plate 425 may include holes 496 that provide access to the inner features in the lower puck plate 420. As shown, the backing plate 425 may include a center hole 492 to provide access to facilities. Additionally, the backing plate 425 includes three holes 494 around lift pin holes 499 in the lower puck plate 420.

Figure 5A:
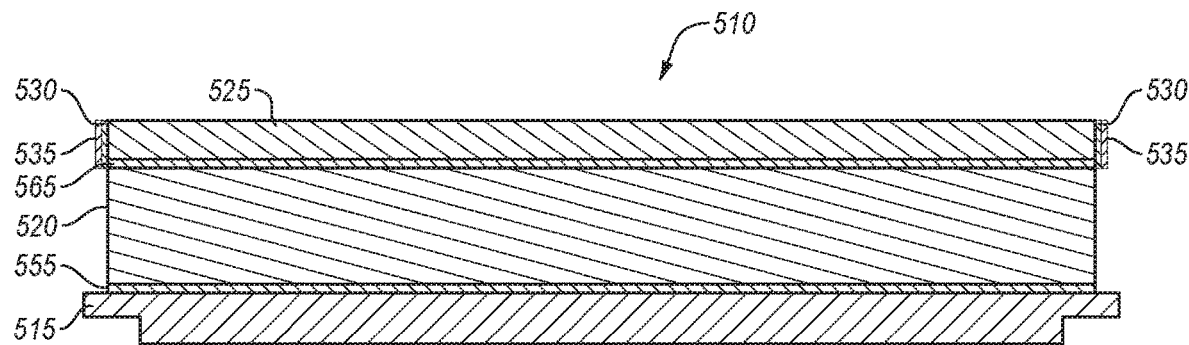
FIG. 5A depicts a sectional side view of an electrostatic puck assembly, in accordance with one embodiment.
Figure 5B:
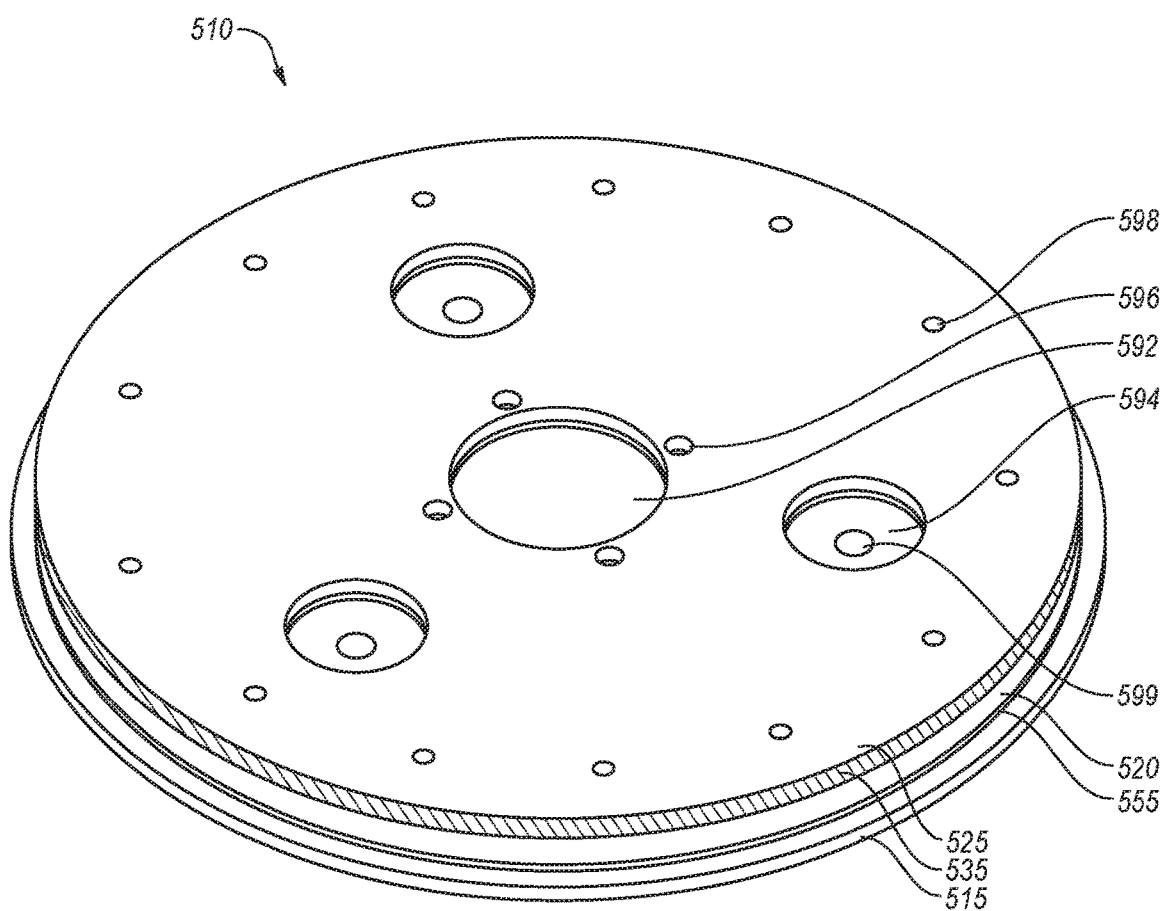
FIG. 5B depicts a perspective view of one embodiment of an electrostatic puck assembly that corresponds to the electrostatic puck assembly of FIG. 5A.

FIG. 5A depicts a sectional side view of an electrostatic puck assembly 510, in accordance with one embodiment. FIG. 5B depicts a perspective view the electrostatic puck assembly 510. Notably, the electrostatic puck assembly 510 is shown upside down to better show particular components of the electrostatic puck assembly 510. The electrostatic puck assembly 510 is substantially similar to electrostatic puck assembly 410. For example, electrostatic puck assembly 510 includes an upper puck plate 515 bonded to a lower puck plate 520 by a metal bond 555. The electrostatic puck assembly 510 further includes the lower puck plate 520 bonded to a backing plate 525 by another metal bond 565. Additionally, the backing plate 525 includes a center hole 592 to provide access to facilities and further includes three holes 594 around lift pin holes 599 in the lower puck plate 520. The backing plate 525 may additionally include holes 596 that provide access to the inner features in the lower puck plate 520.

In electrostatic puck assembly 510, the backing plate 525 has a diameter that is substantially similar to the diameter of the lower puck plate 520. This further equalizes the forces applied to lower puck plate 520 by upper puck plate 515 and backing plate 525. However, in such an embodiment there is no space to dispose an RF gasket that electrically connects the lower puck plate to a base plate. To provide an alternate path for an RF signal, an outer sidewall of the backing plate 525 and the metal bond 565 may be coated with an electrically conductive coating 530. In one embodiment, the electrically conductive coating 530 is a metal coating such as an Aluminum coating. The electrically conductive coating 530 may be applied using sputtering techniques, cold spraying techniques, or other metal deposition techniques. In one embodiment, the electrically conductive coating 530 is covered by a plasma resistant ceramic coating 535. The plasma resistant ceramic coating 535 may be $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride) $Y_2O_3$ stabilized $ZrO_2$ (YSZ), and so on. The plasma resistant ceramic coating 535 may also be a ceramic composite such as $Y_3Al_5O_{12}$ distributed in $Al_2O_3$ matrix, a $Y_2O_3$—$ZrO_2$ solid solution or a SiC—$Si_3N_4$ solid solution. In embodiments, the electrically conductive coating 530 and/or the plasma resistant ceramic coating 535 may also coat an outer wall of the lower puck plate 520, metal bond 555 and/or upper puck plate 515. In one embodiment, the electrically conductive coating 530 and the plasma resistant ceramic coating 535 each have a thickness of about 5-25 microns.

Since backing plate 525 has a diameter that is substantially similar to the diameter of the lower puck plate 520, backing plate 525 covers features (not shown) in the lower puck plate 520 that are configured to receive fasteners. Accordingly, backing plate 525 may additionally include holes 598 that provide access to the features in the lower puck plate 520.

In one embodiment, an electrical path for the RF signal may be provided by doping the backing plate 525 to increase an electrical conductivity of the backing plate 525. In one embodiment, Sm and/or Ce are used to dope the backing plate 525. In one embodiment, the backing plate 525 has an electrical resistivity of less than about $1\times10^9$ Ohm centimeters (10E9 Ohm·cm). In one embodiment, the backing plate has an electrical resistivity of about 10E6 Ohm·cm to 10E7 Ohm·cm. In such an embodiment, the outer wall of backing plate 525 may not be coated by the electrically conductive coating 530. However, the outer wall of backing plate may still be coated with plasma resistant ceramic coating 535.

Figure 6A:
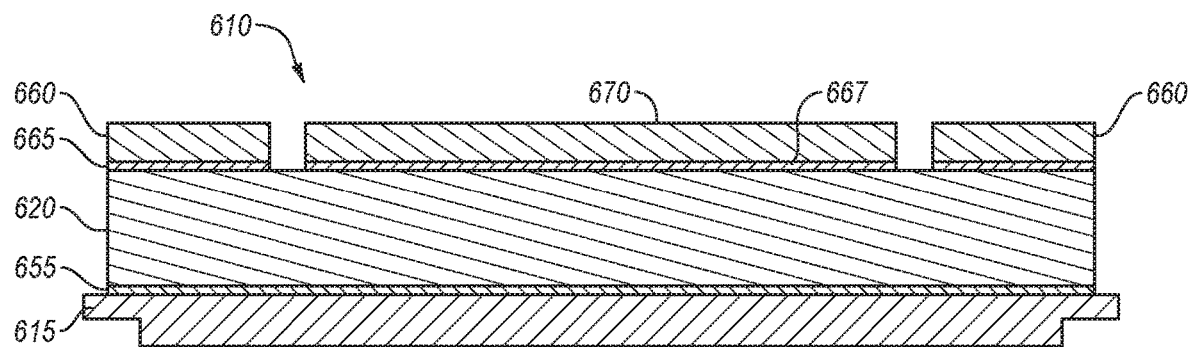
FIG. 6A depicts a sectional side view of an electrostatic puck assembly, in accordance with one embodiment.
Figure 6B:
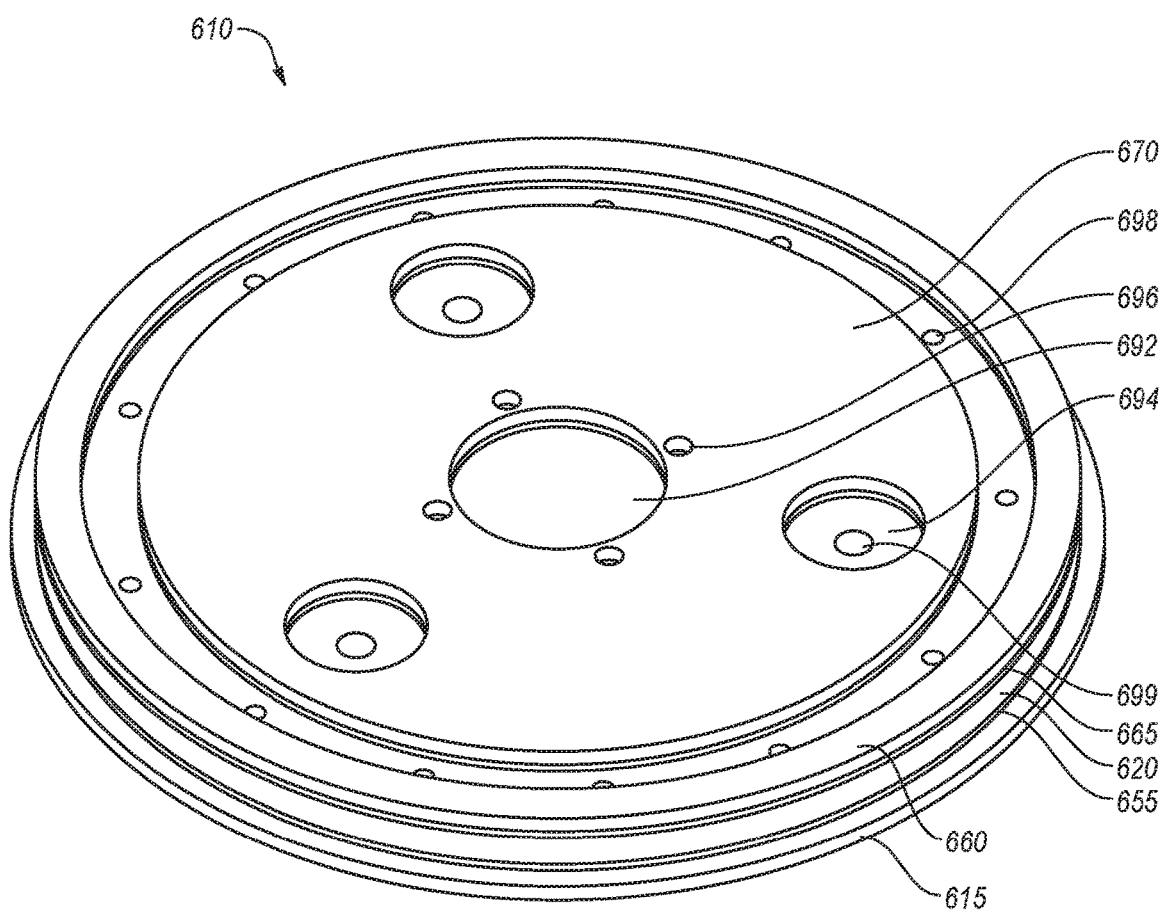
FIG. 6B depicts a perspective view of one embodiment of an electrostatic puck assembly that corresponds to the electrostatic puck assembly of FIG. 5A.

FIG. 6A depicts a sectional side view of an electrostatic puck assembly 610, in accordance with one embodiment. FIG. 6B depicts a perspective view the electrostatic puck assembly 610. Notably, the electrostatic puck assembly 610 is shown upside down to better show particular components of the electrostatic puck assembly 610. The electrostatic puck assembly 610 is substantially similar to electrostatic puck assembly 410. For example, electrostatic puck assembly 610 includes an upper puck plate 615 bonded to a lower puck plate 620 by a metal bond 655. The electrostatic puck assembly 610 further includes the lower puck plate 620 bonded to a backing plate 670 by another metal bond 667. The backing plate 670 includes a center hole 692 to provide access to facilities and further includes three holes 694 around lift pin holes 699 in the lower puck plate 620. The backing plate 670 may additionally include holes 696 that provide access to the inner features in the lower puck plate 620.

In electrostatic puck assembly 610, the backing plate 670 has a diameter that is smaller than a diameter of the lower puck plate 620. In one embodiment, backing plate 670 has a diameter that is approximately equal to the diameter of backing plate 425. Electrostatic puck assembly 610 additionally includes a backing ring 660 that is metal bonded to lower puck plate 620 by metal bond 665. Backing ring 660 has an outer diameter that is substantially similar to the diameter of the lower puck plate 620. This further equalizes the forces applied to lower puck plate 620 by upper puck plate 615 and a combination of the backing plate 670 and the backing ring 660.

A space between the backing plate 670 and the backing ring 660 may provide room for an RF gasket that electrically connects the lower puck plate 620 to a base plate. Additionally, features 698 in the lower puck plate 620 that are configured to receive fasteners may be exposed. In one embodiment, the outer walls of backing ring 660, metal bond 665, lower puck plate 620, metal bond 655 and/or upper puck plate 615 are coated by a plasma resistant ceramic coating as described above with reference to FIGS. 5A-5B.

Figure 7:
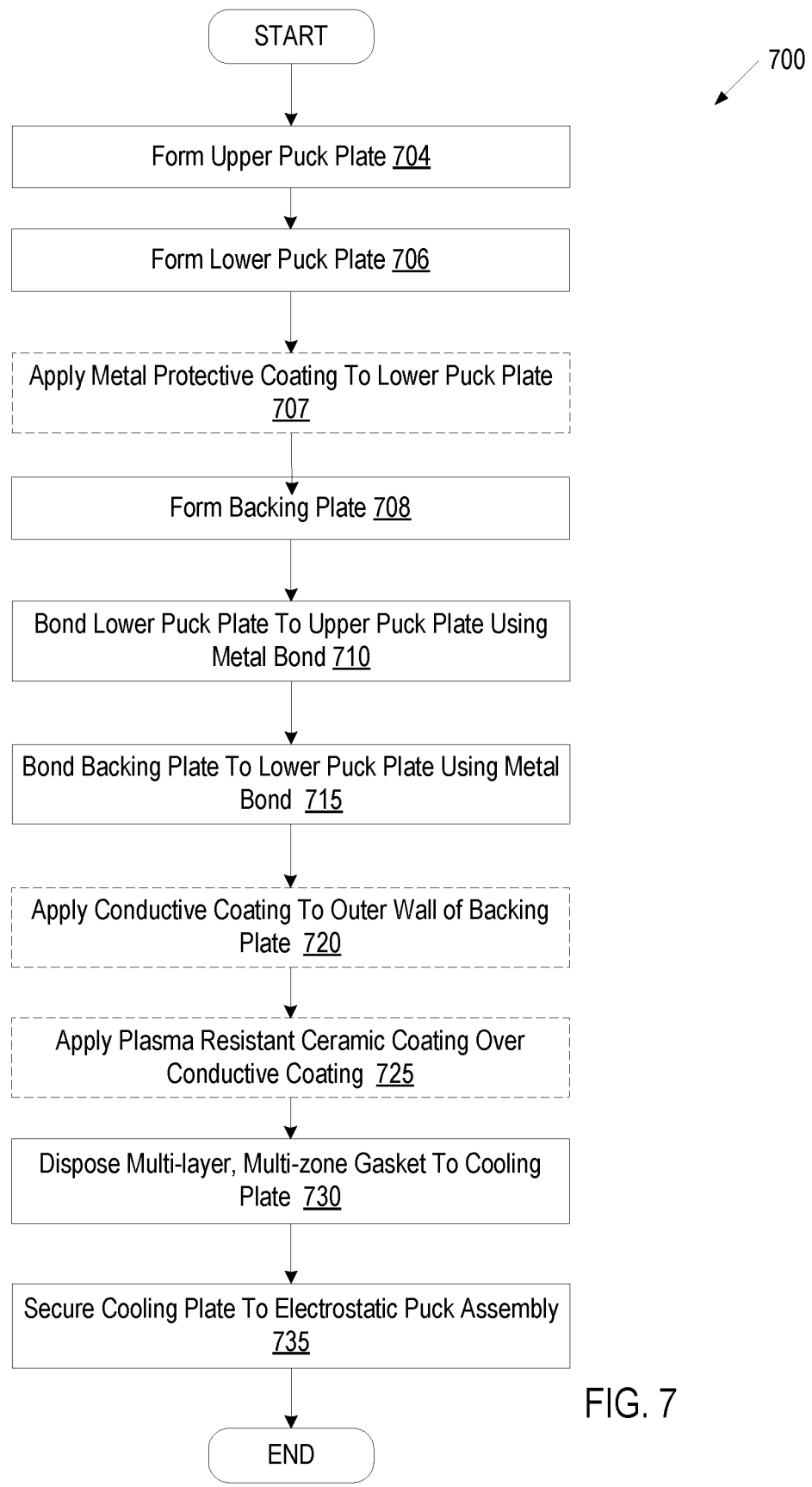
FIG. 7 illustrates one embodiment of a process for manufacturing a substrate support assembly.

FIG. 7 illustrates one embodiment of a process 700 for manufacturing a substrate support assembly. At block 704 of process 700, an upper puck plate is formed. The upper puck plate may be a ceramic disc that includes a clamping electrode and one or more heating elements.

At block 706, a lower puck plate is formed. In one embodiment, features are formed in a lower puck plate for receiving fasteners. Gas holes (e.g., He holes) may also be formed in the lower puck plate for flowing gases.

In one embodiment, at block 707 a metal protective coating is applied to the lower puck plate. A metal protective coating may be applied to the lower puck plate, for example, if the lower puck plate is Molybdenum. The metal protective coating may be applied to ensure that the material of the lower puck plate will not be exposed to plasma or processing gasses. The metal protective coating may have a thickness of about 2-10 microns.

In one embodiment, the metal protective coating is Aluminum or an Aluminum alloy such as Al 6061. In one embodiment, the metal protective coating is applied to the lower puck plate by electroplating. The electroplating may cause the metal protective coating to form over all surfaces of the lower puck plate, including outer walls, a top and bottom, and inner walls of holes and features drilled in the lower puck plate. In another embodiment, the metal protective coating may be applied by metal deposition techniques such as cold spraying or sputtering.

In one embodiment, metal protective plugs are inserted into holes drilled in the lower puck plate instead of, or in addition to, applying the metal protective coating to the lower puck plate. For example, multiple counter-bored through holes may be drilled into the lower puck plate, and Aluminum (or Aluminum alloy) plugs may be inserted into these holes. The plugs may protect a gas delivery area (e.g., the interior of the holes) from exposure to gases. The metal protective coating may or may not then be applied over the lower puck plate.

In one embodiment, an outer wall of the lower puck plate is bead blasted to roughen the outer wall to a roughness (Ra) of about 100-200 micro-inches. The outer wall may then be plasma sprayed with a plasma resistant ceramic coating. The plasma resistant ceramic coating may be formed over the metal protective coating in embodiments. In one embodiment, the plasma resistant ceramic coating has a thickness of about 2-10 microns. In a further embodiment, the plasma resistant ceramic coating has a thickness of about 3 microns.

At block 708, a backing plate is formed. One or more holes may be formed in the backing plate (e.g., by drilling) to provide access to the features and/or gas holes in the lower puck plate. In one embodiment, in which plugs are inserted into holes in the lower puck plate, gas grooves are formed in an upper side of the backing plate (where the backing plate will contact the lower puck plate). These gas grooves may provide access for gases to be flowed through the plugs, then through holes in the upper puck plate. In one embodiment, the holes in the upper puck plate include a porous plug. Holes may also be drilled in the backing plate to provide a path for the gases to be flowed into the gas grooves.

At block 710, the lower puck plate is metal bonded to an upper puck plate using a first metal bond. At block 715, the backing plate is metal bonded to the lower puck plate using a second metal bond. A multilayer stack including the upper puck plate, the lower puck plate and the backing plate may form an electrostatic puck assembly.

In one embodiment, the first metal bond is formed by placing a metal foil of Al or AlSi alloy between the upper puck plate and the lower puck plate. In one embodiment, the second metal bond is formed by placing an additional metal foil of Al or AlSi alloy between the lower puck plate and the backing plate. The metal foils may be approximately 50 microns thick in one embodiment. Pressure and heat may be applied to form a first diffusion bond between the metal foil, the upper puck plate and the lower puck plate and to form a second diffusion bond between the additional metal foil, the lower puck plate and the backing plate. In one embodiment, a stack is formed that includes the upper puck plate, the metal foil, the lower puck plate, the additional metal foil and the backing plate. This stack may then be hot pressed to form the first metal bond and the second metal bond in a single bonding process.

In one embodiment, at block 720 an electrically conductive coating is applied to an outer wall of the backing plate. The electrically conductive coating may also be applied over the metal bonds and/or over the lower puck plate. The electrically conductive coating may be a metal coating applied by cold spraying, sputtering, or other metal deposition technique. In one embodiment, at block 725 a plasma resistant ceramic coating is applied over the electrically conductive coating. The plasma resistant ceramic coating may be applied by plasma spraying, IAD, or other ceramic deposition technique.

At block 730, a thermal gasket is applied to a cooling plate. The thermal gasket may be a multi-layer, multi-zone gasket as described in embodiments herein. At block 735, the cooling plate is secured to the electrostatic puck assembly. In one embodiment, fasteners are inserted into the features in the lower puck plate and/or the cooling plate. In one embodiment, the fasteners are inserted into the lower puck plate prior to the lower puck plate being bonded to the upper puck plate. In such an embodiment, the fasteners may be permanently embedded into the puck. The electrostatic puck assembly may then be coupled to the cooling plate by tightening the fasteners (e.g., by threading bolts protruding from the features in the lower puck plate into nuts residing in the features in the cooling plate).

Figure 8:
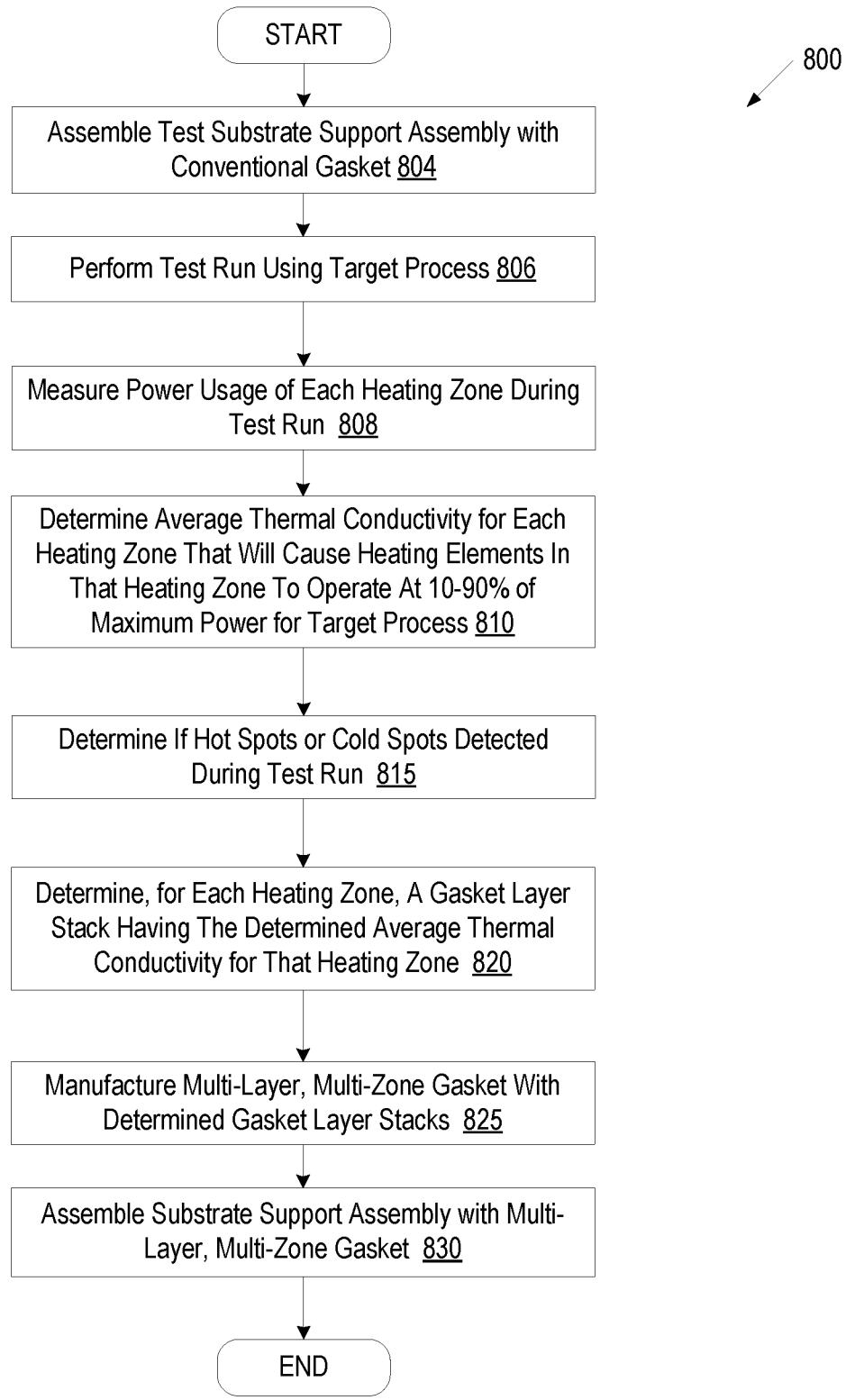
FIG. 8 illustrates one embodiment of another process for manufacturing a substrate support assembly.

FIG. 8 illustrates one embodiment of another process 800 for manufacturing a substrate support assembly. At block 804 of process 800, a test substrate support assembly is assembled with a conventional gasket. For example, the operations of process 700 may be performed. However, at block 730 a standard thermal gasket may be used rather than one of the multi-layer, multi-zone thermal gaskets described in embodiments herein.

At block 806, the test substrate support assembly is inserted into a processing chamber. At block 806, one or more test runs may then be performed using a target process or set of target processes. A particular process may have the same target temperature for each zone of the substrate support assembly or may have different target temperatures for different zones. During the test runs, the power levels of the heating elements in each of the heating zones of the substrate support assembly are measured and recorded at block 808. This may provide a temperature profile for the substrate support assembly. In an example, the temperature profile may show that the heating elements of some heating zones are operating at 5-10% of maximum power, that the heating elements of other heating zones are operating at 50-60% of maximum power, and that the heating elements of still other heating zones are operating at 93-97% of maximum power. Different processes may or may not use plasma. Additionally, for those processes that use plasma, the power profile for the plasma may vary between heating zones of the substrate support assembly. This may cause the plasma to heat some zones more than other zones, which affects the temperature profile.

The thermal conductivity of the thermal gasket used for the test substrate support assembly may be known. The heating elements of each heating zone may have a maximum power rating. A goal is for all of the heating elements to operate at greater than about 10% of the maximum power and to operate at less than 90% of the maximum power. In one embodiment, a goal is for all of the heating elements to operate at greater than about 15% of the maximum power and to operate at less than 85% of the maximum power. In one embodiment, a goal is for all of the heating elements to operate at greater than about 20% of the maximum power and to operate at less than 80% of the maximum power.

The temperature profile may be used to determine a target average thermal conductivity for each zone of a multi-layer, multi-zone gasket that will achieve the goal set forth above. Each of the zones of the gasket may approximately align with a heating zone of the substrate support assembly. The gasket separates a plate or assembly that includes the heating zones (e.g., an electrostatic puck assembly) from a cooling plate. By increasing the thermal conductivity of a zone, thermal flux between the cooling plate and the plate or assembly at that zone is increased. Similarly, by decreasing the thermal conductivity of a zone, the thermal flux between the cooling plate and the plate or assembly at that zone is decreased. Accordingly, in the above example the thermal conductivity of the zone of the gasket that corresponds to the heating zone that experienced the 5-10% maximum power usage may be increased as compared to the thermal conductivity of the conventional gasket. This may cause the heating zone to be cooled faster, which would cause the heating zone to work at a higher power (e.g., of say 50-60% of maximum power). Additionally, in the above example the thermal conductivity of the zone of the gasket that corresponds to the heating zone that experienced the 93-97% maximum power usage may be decreased as compared to the thermal conductivity of the conventional gasket. This may cause the heating zone to be cooled more slowly, which would cause the heating zone to work at a lower power (e.g., of say 50-60% of maximum power).

At block 815, a determination may be made as to whether there are any hot spots within any heating zones of the plate or assembly (e.g., the electrostatic puck assembly). Similarly, a determination may be made as to whether there are any cold spots in any area of the cooling plate that correspond to a particular heating zone. Hot spots may be addressed by constructing a multi-layer stack of the gasket for a particular zone that includes a top gasket layer that has a high thermal conductivity in the x-y plane (e.g., in a plane that is defined by a surface area of the gasket). Cold spots may be addressed by constructing a multi-layer stack of the gasket for a particular zone that includes a bottom gasket layer that has a high thermal conductivity in the x-y plane (e.g., in a plane that is defined by a surface area of the gasket). Some types of grafoil may have a thermal conductivity of about 400-1200 W/m·K in the x-y plane, for example. Accordingly, one or more gasket layers in the stack of gasket layers in one zone may have a thermal conductivity in the x-y plane that is different from the thermal conductivity of a corresponding gasket layer in another stack of gasket layers in another zone in the x-y plane.

At block 820, a stack of gasket layers (or a single gasket layer) is determined for each zone of the gasket. Each zone may have a unique stack of gasket layers (or a single gasket layer) or may have a stack of gasket layers that matches a stack of gasket layers in another zone. Each determined stack of gasket layers or single gasket layer approximately has a target thermal conductivity for a particular zone of the gasket. A stack of gasket layers or single gasket layer for a zone may be determined by modeling a gasket layer stack, where the model takes into account at least the following for each layer of the gasket layer stack: thickness, material, and thermal conductivity of the selected material. The model of the gasket layer stack may also take into consideration interstitial resistance between gasket layers.

A target thickness may be determined for the gasket, and the stack of gasket layers for each zone may approximately have the target thickness. A gasket layer stack that is to have a high thermal conductivity (e.g., over 50 W/m·K) may include one or more layers of graphoil, with no other gasket layers. A gasket layer stack that is to have a high thermal conductivity may alternatively have one or more layers of a metal foil (e.g., aluminum foil) and multiple layers of grafoil. For example, a gasket layer stack may include a bottom layer of grafoil, an intermediate layer of aluminum foil, and a top layer of grafoil. A gasket layer stack that is to have a low thermal conductivity may include a bottom layer of grafoil, an intermediate layer of polyimide or a fluoropolymer, and a top layer of grafoil.

In one embodiment, the stack of gasket layers for each zone has a top layer of grafoil and a bottom layer of grafoil. Grafoil may be used as the top and bottom layers because grafoil is a very soft material and upon compression with the ceramic plate (e.g., of the electrostatic puck assembly) and the cooling plate will compress into micro-crevices in the ceramic plate and cooling plate. Grafoil may also be used as an intermediate layer between any other layers in a stack of gasket layers. For example, a gasket layer stack may include, from bottom to top, grafoil, a second material, grafoil, the second material or a third material, grafoil, and so on. In one embodiment, one or more zones includes a single gasket layer that is composed of grafoil.

At block 825, a multi-layer, multi-zone gasket is formed. Each zone has a gasket layer stack (or a single gasket layer in some instances) that has been configured for that zone. The different zones are then fitted together to form the multi-layer, multi-zone gasket. In one embodiment, the different zones are bonded together. Alternatively, the different zones may be pressure fit together. Alignment pins can be used to align and stack the gasket layers for each zone of the gasket. In one embodiment, there can be a gap (e.g., a 1 mm gap) between zones of the gasket. Alternatively, different zones of the gasket may be touching. At block 830, a substrate support assembly may be formed as set forth in process 700 using the created multi-layer, multi-zone gasket at block 730. In one embodiment, the different gasket layers for each zone of the gasket are stacked onto the cooling plate at the appropriate location to line up with the corresponding heating zone. The gasket layers of the various zones may be formed so that they are touching one another or so that there is a gap between zones.

The heating elements in each of the plurality of heating zones of the ceramic plate (e.g., electrostatic puck assembly) have a power rating. The average thermal conductivity tailored for each of the zones of the gasket causes the one or more heating elements of each of the corresponding heating zones to maintain a supported substrate at a target temperature while staying within 20-80% of the power rating.

Figure 9A:
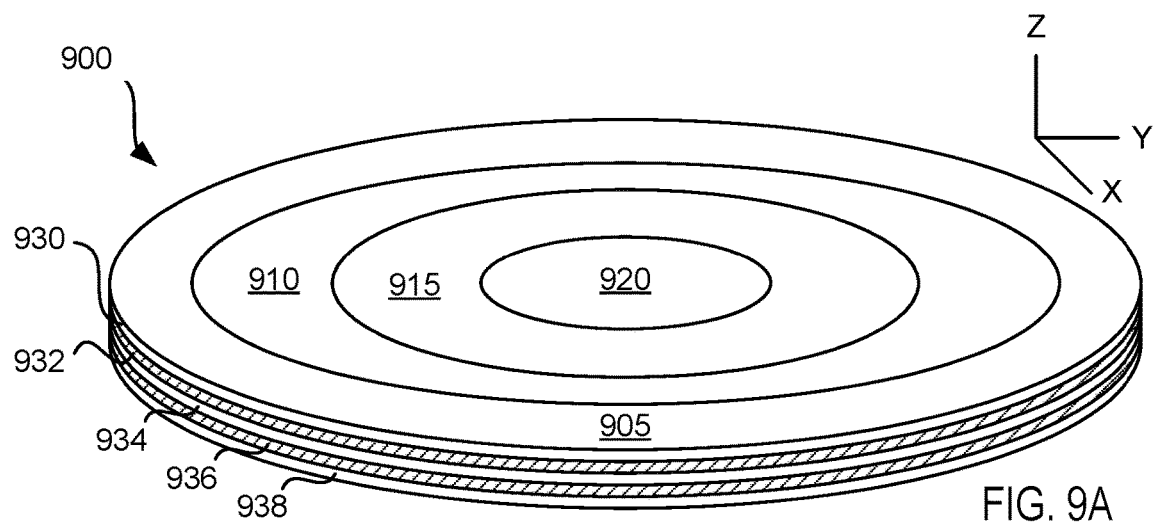
FIG. 9A illustrates a perspective view of one embodiment of a multi-layer, multi-zone gasket.
Figure 9B:
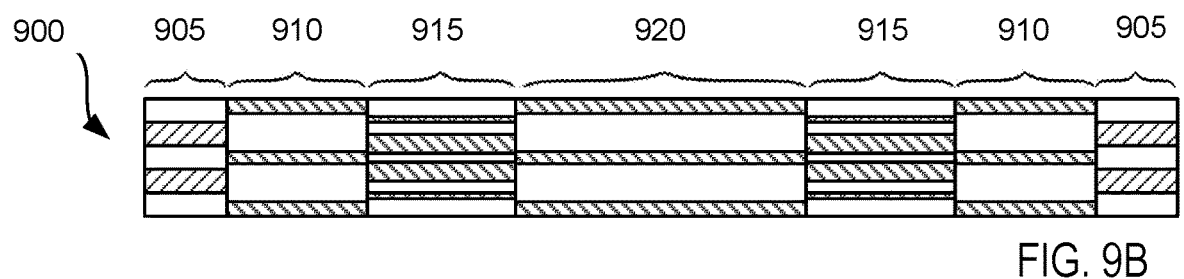
FIG. 9B illustrates a cross-sectional side view of the multi-layer, multi-zone gasket of FIG. 9A.
Figure 10:
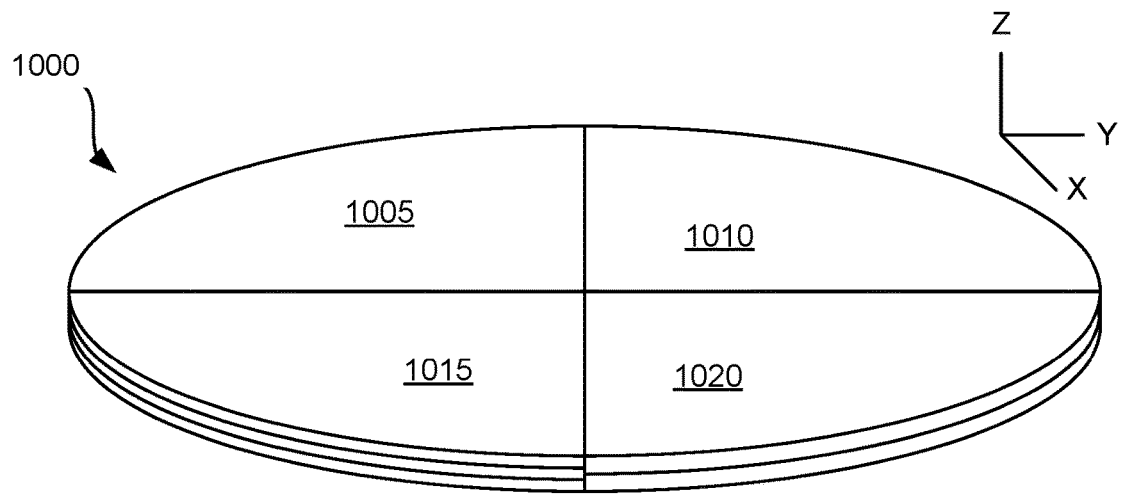
FIG. 10 illustrates a perspective view of another embodiment of a multi-layer, multi-zone gasket.

FIG. 9A illustrates a perspective view of one embodiment of a multi-layer, multi-zone gasket 900. FIG. 9B illustrates a cross-sectional side view of the multi-layer, multi-zone gasket 900 of FIG. 9A. As shown, the gasket 900 includes four zones. The four zones are approximately concentric zones in the illustrated example. However, in alternative embodiments the zones may not be concentric (e.g., as shown in FIG. 10). Alternatively, some of the zones may be concentric while other zones are not concentric. The illustrated four zones include a first zone 905, a second zone 910, a third zone 915 and a fourth zone 920. The first zone 905, second zone 910 and third zone 915 are ring shaped, while the fourth zone 920 is disc shaped.

The first zone 905 includes 5 gasket layers. The second zone 910 also includes 5 gasket layers, but of different materials and/or thicknesses from those of the first zone 905. The third zone includes 9 gasket layers, and the fourth zone includes 5 gasket layers. Each zone may have any number of gasket layers in embodiments. Each zone may have a distinct average thermal conductivity in the z-direction. One or more gasket layers in any of the zones may also have specific thermal conductivity in the x-y plane. In one embodiment, each zone has a thermal conductivity in the z-direction of between 0.2 W/m·K and 150 W/m·K. Individual layers of grafoil may have a thermal conductivity of anywhere from 140 W/m·K to 1200 W/m·K in the x-y plane. The gasket 900 may have a thickness of about 0.2-2 mm in embodiments. Each individual gasket layer in a gasket layer stack may have a thickness of about 3 mils to about the thickness of the gasket 900. Grafoil layers may have thicknesses of about 3-40 mils in some embodiments.

FIG. 10 illustrates a perspective view of another embodiment of a multi-layer, multi-zone gasket 1000. The gasket 1000 includes four pie-shaped zones 1005, 1010, 1015 and 1020.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A gasket comprising:
    a top surface having a surface area; and
    a plurality of zones that together define the surface area of the top surface, the plurality of zones comprising:
        a first zone comprising a first stack of gasket layers, the first zone having a first average thermal conductivity in a first direction; and
        a second zone comprising one or more gasket layers, the second zone having a second average thermal conductivity in the first direction;
    wherein at least one of:
        a) the first stack of gasket layers comprises a first number of gasket layers and the one or more gasket layers in the second zone comprises a second number of gasket layers that differs from the first number of gasket layers;
        b) at least one gasket layer in the first stack of gasket layers comprises a first material that is not present in the one or more gasket layers in the second zone; or
        c) the one or more gasket layers in the second zone comprises a second stack of gasket layers, wherein one or more gasket layers in the first stack of gasket layers has a third thermal conductivity in a second direction that is different from a fourth thermal conductivity of a corresponding gasket layer in the second stack of gasket layers in the second direction, and wherein the second direction is orthogonal to the first direction.

2. The gasket of claim 1, wherein the first stack of gasket layers comprises the first number of gasket layers and the one or more gasket layers in the second zone comprises the second number of gasket layers that differs from the first number of gasket layers.

3. The gasket of claim 1, wherein at least one gasket layer in the first stack of gasket layers comprises the first material that is not present in the one or more gasket layers in the second zone.

4. The gasket of claim 1, wherein the plurality of zones further comprises at least one of:
    a third zone having a third average thermal conductivity in the first direction; or
    a fourth zone having a fourth average thermal conductivity in the first direction.

5. The gasket of claim 1, wherein the gasket has a thickness of about 0.2-2.0 mm, and wherein the first stack of gasket layers approximately has the thickness of 0.2-2.0 mm.

6. The gasket of claim 1, wherein the first direction is orthogonal to the surface area.

7. The gasket of claim 1, wherein the first zone is approximately concentric with the second zone.

8. The gasket of claim 1, wherein at least one of a top gasket layer or a bottom gasket layer of the first stack of gasket layers comprises grafoil.

9. The gasket of claim 8, wherein one or more intermediate gasket layers of the first stack of gasket layers comprises at least one of a metal, polyimide, silicone, rubber or a fluoropolymer.

10. The gasket of claim 1, wherein the one or more gasket layers in the second zone comprises the second stack of gasket layers, wherein one or more gasket layers in the first stack of gasket layers has the third thermal conductivity in the second direction that is different from the fourth thermal conductivity of the corresponding gasket layer in the second stack of gasket layers in the second direction, and wherein the second direction is orthogonal to the first direction.

11. The gasket of claim 1, wherein the second zone comprises a single gasket layer comprising grafoil.

12. A substrate support assembly comprising:
a puck comprising a plurality of heating zones, wherein each of the plurality of heating zones comprises one or more heating elements;
a gasket, wherein a top surface of the gasket contacts the puck, the gasket comprising a plurality of zones that approximately align with the plurality of heating zones, the plurality of zones comprising:
a first zone comprising a first stack of gasket layers, the first zone having a first average thermal conductivity in a first direction; and
a second zone comprising one or more gasket layers, the second zone having a second average thermal conductivity in the first direction; and
a cooling plate, wherein a bottom surface of the gasket contacts the cooling plate.

13. The substrate support assembly of claim 12, wherein the gasket is compressed between the puck and the cooling plate, wherein the first direction is orthogonal to the top surface, and wherein the gasket has a thickness of approximately 0.2-2.0 mm.

14. The substrate support assembly of claim 12, wherein the one or more heating elements of each the plurality of heating zones has a power rating, wherein the first average thermal conductivity causes the one or more heating elements of a first heating zone of the plurality of heating zones to maintain a supported substrate at a target temperature while staying within 20-80% of the power rating, and wherein the second average thermal conductivity causes the one or more heating elements of a second heating zone of the plurality of heating zones to maintain the target temperature or an alternate target temperature while staying within 20-80% of the power rating.

15. The substrate support assembly of claim 12, wherein the first stack of gasket layers comprises a first number of gasket layers and the one or more gasket layers in the second zone comprises a second number of gasket layers that differs from the first number of gasket layers.

16. The substrate support assembly of claim 12, wherein one or more gasket layers in the first stack of gasket layers comprises a first material that is not present in the one or more gasket layers in the second zone.

17. The substrate support assembly of claim 12, wherein at least one of a top gasket layer or a bottom gasket layer of the first stack of gasket layers comprises grafoil and has a thermal conductivity of approximately 100-1200 Watts per meter Kelvin in a second direction that is orthogonal to the first direction.

18. The substrate support assembly of claim 12, wherein one or more intermediate gasket layers of the first stack of gasket layers comprises at least one of a metal, polyimide, silicone, rubber or a fluoropolymer.

19. The substrate support assembly of claim 12, wherein the one or more gasket layers in the second zone comprises a second stack of gasket layers, wherein one or more gasket layers in the first stack of gasket layers has a third thermal conductivity in a second direction that is different from a fourth thermal conductivity of a corresponding gasket layer in the second stack of gasket layers in the second direction, wherein the second direction is orthogonal to the first direction.

20. A substrate support assembly comprising:
an electrostatic puck comprising:
an electrically insulative upper puck plate comprising one or more heating elements and one or more electrodes to electrostatically secure a substrate;
a lower puck plate bonded to the electrically insulative upper puck plate by a first metal bond; and
an electrically insulative backing plate bonded to the lower puck plate by a second metal bond;
a cooling plate coupled to the electrostatic puck; and
a gasket compressed between the electrostatic puck and the cooling plate, the gasket comprising a plurality of zones, wherein a first zone of the plurality of zones comprises a first stack of gasket layers and has a first average thermal conductivity in a first direction, and wherein a second zone of the plurality of zones comprises one or more gasket layers and has a second average thermal conductivity in the first direction.

\* \* \* \* \*